(12) United States Patent
Verma

(10) Patent No.: US 8,445,960 B2
(45) Date of Patent: May 21, 2013

(54) SELF-ALIGNED BODY FULLY ISOLATED DEVICE

(75) Inventor: Purakh Raj Verma, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 13/609,270

(22) Filed: Sep. 11, 2012

(65) Prior Publication Data

US 2013/0001688 A1     Jan. 3, 2013

Related U.S. Application Data

(62) Division of application No. 12/908,860, filed on Oct. 20, 2010, now Pat. No. 8,288,235.

(51) Int. Cl.
  *H01L 29/78* (2006.01)
  *H01L 27/088* (2006.01)

(52) U.S. Cl.
  USPC ............. 257/337; 257/335; 257/E27.06

(58) Field of Classification Search
  USPC .................................. 257/335, 337
  See application file for complete search history.

(56) References Cited

U.S. PATENT DOCUMENTS

| 7,575,977 | B2 | 8/2009 | Levin et al. | |
| 7,713,795 | B2* | 5/2010 | Choi | 438/142 |
| 2009/0218620 | A1* | 9/2009 | Hebert et al. | 257/336 |
| 2010/0032756 | A1* | 2/2010 | Pendharkar et al. | 257/337 |
| 2011/0241108 | A1* | 10/2011 | Zuniga | 257/337 |
| 2011/0303976 | A1* | 12/2011 | Kocon et al. | 257/337 |
| 2012/0094457 | A1* | 4/2012 | Gabrys | 438/286 |
| 2012/0126320 | A1* | 5/2012 | Braithwaite et al. | 257/337 |
| 2012/0193709 | A1* | 8/2012 | Sukegawa et al. | 257/337 |
| 2013/0026565 | A1* | 1/2013 | Verma et al. | 257/337 |

* cited by examiner

*Primary Examiner* — Alexander Ghyka
(74) *Attorney, Agent, or Firm* — Horizon IP Pte. Ltd.

(57) ABSTRACT

A device having a self-aligned body on a first side of a gate is disclosed. The self-aligned body helps to achieve very low channel length for low Rdson. The self-aligned body is isolated, enabling to bias the body at different bias potentials. The device may be configured into a finger architecture having a plurality of transistors with commonly coupled, sources, commonly coupled gates, and commonly coupled drains to achieve high drive current outputs.

20 Claims, 20 Drawing Sheets

US 8,445,960 B2

SELF-ALIGNED BODY FULLY ISOLATED DEVICE

CROSS-REFERENCE TO RELATED APPLICATIONS

This application is a divisional application of co-pending U.S. patent application Ser. No. 12/908,860 filed Oct. 20, 2010. The application is hereby incorporated by reference in its entirety.

BACKGROUND

Various voltage level devices may be included in an integrated circuit (IC). For example, low, intermediate and high power devices are provided in an IC. Low power devices may be used for complementary metal oxide semiconductor (CMOS) for logic circuitry, intermediate voltage devices for analog circuitry and high power devices for output high voltage interface stages. It is desirable for high voltage devices to have fast switching speed. The performance of such devices depends on the on resistance (Rdson), drain to source breakdown voltage (BVdss) and gate charge (Qgg) of the device. For example, higher performance is achieved with low Rdson, high BVdss and/or low Qgg.

It is desirable to provide improved performance and reliability of a device by lowering Rdson and Qgg and increasing BVdss.

SUMMARY

A method of forming a device is disclosed. The method comprises providing a substrate defined with a device region. The device region includes a drift well having first polarity type dopants. A gate of a transistor is formed in the device region. The gate having first and second sides. Second polarity type dopants are implanted into the substrate in a first side of the gate to form a body within the drift well. The implant is self-aligned to the gate. The body has an under-lap portion on the first side of the gate with a length L, wherein the length L is small to achieve a low Rdson. First and second diffusion regions having first polarity type dopants are formed in the substrate in the device region adjacent to the first and second sides of the gate, wherein the first diffusion region is within the body and the second diffusion region is within the drift well.

In another embodiment, the method of forming a device comprises providing a substrate prepared with first and second isolation wells in a device region. The second isolation well is disposed with the first isolation well. A drift well is formed within the second isolation well. A gate of a transistor is formed on the substrate in the device region. The gate includes first and second sides. A body of the transistor is formed in the substrate adjacent to the first side of the gate, wherein forming the body is a self-aligned forming process to the gate. The body includes an under-lap portion beneath the gate. The under-lap portion having a length L determined by the self-aligned forming process. First and second diffusion regions adjacent to the first and second sides of the gate are formed. The first diffusion region is within the body and the second diffusion region is within the drift well.

In yet another embodiment, a device is disclosed. The device includes a substrate defined with a device region. A transistor in the device region, wherein the transistor includes a gate having first and second sides, a first diffusion region in device region adjacent to the first side of the gate and a second diffusion region in the device region adjacent to the second side of the gate. The first and second diffusion regions comprise dopants of a first polarity type. A self-aligned body is disposed in the substrate adjacent to the first side of the gate. The body comprises dopants of a second polarity type. The self-aligned body encompassing the first diffusion region, the self-aligned body having an under-lapping portion under the gate in which the under-lapping portion has a length L. A drift well having dopants of the first polarity type is formed in the substrate. The drift well encompasses at least a portion of the body and second diffusion region. A second isolation well is disposed in the substrate and encompasses the drift well. The second isolation well has second polarity type dopants. A body connector having second polarity type dopants is provided to be in communication with the body and second isolation well.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. Some embodiments relate to devices, such as low power-loss buck and boost regulators, power amplifiers and power management circuits. Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1A:
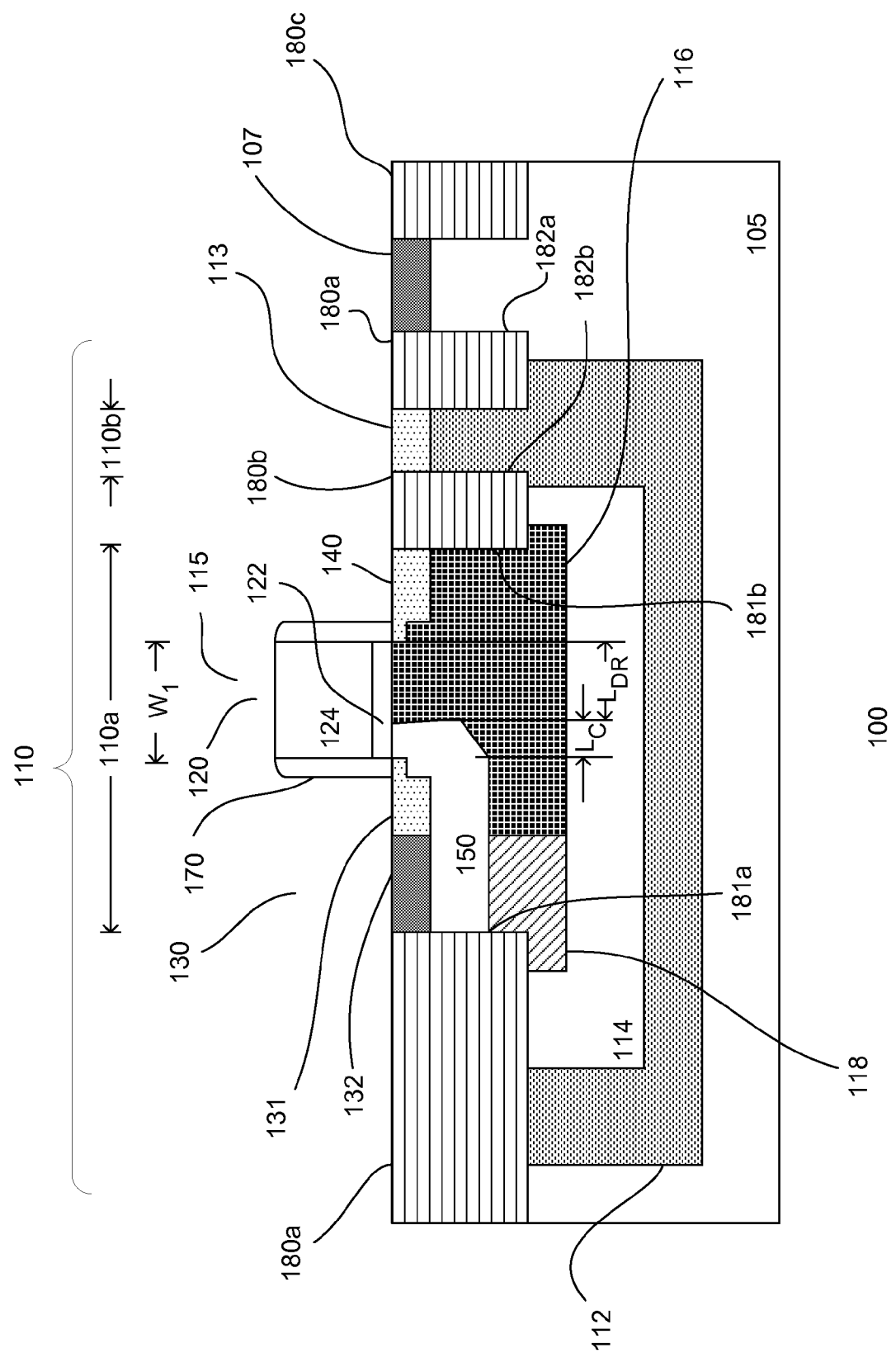
FIGS. 1*a-d* show cross-sectional views of embodiments of a device.

FIG. 1*a* shows a cross-sectional view of an embodiment of a device 100. The device, as shown, is formed in a device region 110 defined on a substrate 105. The substrate, for example, is a semiconductor substrate, such as a silicon substrate. In one embodiment, the substrate comprises a p-type doped substrate. The p-type doped substrate may be a lightly doped p-type substrate. Other types of semiconductor substrates, including those which are undoped or doped with the same or other types of dopants may also be useful. For example, the substrate may be a lightly doped p-type ($p^-$) or un-doped silicon layer on a heavily doped p-type ($p^+$) bulk or an un-doped or $p^-$ silicon on insulator. The substrate may also be other types of substrates.

Isolation regions 180 may be provided for isolating or separating different regions of the substrate. In one embodiment, the device region is isolated from other regions by a device isolation region 180*a*. For example, the device isolation region surrounds the device region. As shown, a portion of the device isolation region is a wide portion while another portion is a narrow portion. Providing a device isolation region having other configurations may also be useful. For example, all portions of the isolation region may be narrow portions. An internal device isolation region 180b may be provided to separate the device region into sub-regions. The substrate, as shown, includes an external isolation region 180c. The isolation regions, for example, are shallow trench isolation (STI) regions. Other types of isolation regions may also be employed. For example, the isolation regions may be deep trench isolation (DTI) regions. The STI regions, for example, extend to a depth of about 2000-4000 Å. In the case of DTI regions, the depth may be about 1-30 μm. Providing STI regions which extend to other depths may also be useful.

A transistor sub-region 110a is provided in the device region. The transistor sub-region is defined by the device isolation region and internal device isolation region. For example, the transistor sub-region is defined by an inner edge 181a of the device isolation region and a first edge 181b of the internal device isolation region. Disposed in the transistor sub-region is a transistor 115. The transistor includes a gate 120. A source region 130 and a drain region 140 are disposed in the substrate in the transistor sub-region adjacent to the gate. For example, the source region is disposed in the transistor sub-region adjacent to the gate and device isolation region while the drain region is adjacent to the gate and internal device isolation region.

The gate includes, for example, a gate electrode 124 over a gate dielectric 122. The gate dielectric may comprise silicon oxide. Alternatively, the gate dielectric may comprise silicon oxy-nitride. Other types of gate dielectric materials, such as a high k dielectric material or a composite gate dielectric having a combination of various dielectric materials such as silicon oxide, silicon nitride, other types of dielectric materials or a combination thereof, may be useful. In one embodiment, the gate dielectric comprises a high voltage gate dielectric. The high voltage gate dielectric may be about 20-1000 Å thick. The gate dielectric may be in the lower thickness range for lower operating voltages while in the higher thickness range for higher operation voltages, for example, at about 40-60 V. Other thicknesses or other types of gate dielectrics may also be useful. As for the gate electrode, it may comprise polysilicon. Other types of gate electrode materials, such as different types of metallic materials, may also be useful.

The gate has a width $W_1$ which is measured from sidewall to sidewall. For example, the width $W_1$ is measured along the direction of the channel length "$L_C$". The dimensions of $W_1$ may be from about 0.2 μm to tens of microns. Providing gates having other widths may also be useful. For example, the width $W_1$ may depend upon the operating voltage at the drain as well as the length of the drift region $L_{DR}$. The drift region, for example, is the region between the drain and the channel (e.g., from the right edge of $L_c$ to the drain region 140). Gates with larger widths may be used to increase the $L_{DR}$ for higher voltage applications while smaller gates with smaller widths may be used for lower voltage applications.

In one embodiment, the source region includes first and second sub-source regions 131 and 132. The first sub-source region, which is adjacent to the gate, and the drain region have first polarity type dopants. The first sub-source region serves as a source of the transistor. For example, the first sub-source region and drain region have n-type dopants for a n-type device. Alternatively, the first sub-source region and drain region may have p-type dopants for a p-type device. The second sub-source region, which is adjacent to the device isolation region and the first sub-source region, has a second polarity type dopant. The second polarity type dopant, for example, is p-type. The source and drain regions are heavily doped regions. The depth of the source and drain regions may be about 0.05-0.5 μm. Providing source and drain regions having other depths may also be useful. Additionally, it is not necessary that the source and drain regions have the same depth. The first sub-source region serves as a source terminal of the transistor; the drain region serves as a drain terminal of the transistor.

The device may include doped regions having different dopant concentrations. For example, the device may include heavily doped, intermediately doped and lightly doped regions. The doped regions may be designated by $x^-$, $x$ and $x^+$, where x indicates the polarity of the doping, such as p-type or n-type, and:

$x^-$=lightly doped;
x=intermediately doped; and
$x^+$=heavily doped.

A lightly doped region may have a dopant concentration of about 1E14-1E16/CC, an intermediately doped region may have a dopant concentration of about 5E15-5E18/CC, and a heavily doped region may have a dopant concentration of about 5E18-2E20/CC. Providing other dopant concentrations for the different doped regions may also be useful. P-type dopants may include boron (B), aluminum (Al), indium (In) or a combination thereof, while n-type dopants may include phosphorus (P), arsenic (As), antimony (Sb) or a combination thereof.

In one embodiment, dielectric sidewall spacers are provided on sidewalls of the gate. The dielectric sidewall spacers can be, for example, silicon oxide or silicon nitride. Other types of dielectric materials may also be useful. In other embodiments, the sidewall spacers may be a plurality of dielectric layers to form, for example, a composite spacer or spacer stack. Other configuration of spacers may also be useful. The sidewall spacers may be employed to define source and drain extension regions. Additionally, the sidewall spacers may prevent shorting of the source and drain regions to the gate electrode by the salidation process used to form the salidicide contacts.

A device body 150 is disposed in the first portion of the device region. The device body has second polarity type dopants with, for example, an intermediate dopant concentration (e.g., x). The second polarity type, for example, is p-type for a n-type device. Alternatively, the second polarity type may be n-type for a p-type device. The device body encompasses the source region. The device body completely encompasses the source region, for example, including the first and second sub-source regions. The second sub-source region may serve as a body contact for the device body since they both have the same polarity type dopants.

The bottom or depth of the device body should be sufficiently deep to serve as a body of the transistor. The depth, for example, is about 0.3-10 μm. Such depths may be useful for operating voltages from about 5-100 V. In other embodiment, the depth of the device up may be to a couple of microns. Other depths may also be useful and may depend on the operating voltage of the device. As shown, a bottom of the device body is below the bottom of the source region and above the bottom of the device isolation region. Providing a device body having other depths may also be useful.

The body extends beyond the source region, under-lapping a portion of the gate. The portion of the body under-lapping the gate defines the channel of the transistor. The amount of under-lap under the gate electrode defines a length $L_c$ of the channel of the transistor. The channel length $L_c$ may be from about 0.05 μm to a couple of μm. The desired length $L_c$ may depend on, for example, the maximum voltage at the drain.

In accordance with one embodiment, the device body is a self-aligned device body. Providing a self-aligned body avoids the use of an implant mask. For example, the device body is self-aligned to the source region of the transistor between the device isolation region and the gate. The self-aligned device body enables the under-lap portion $L_c$ well controlled. A well controlled under-lap portion enables the channel $L_c$ in the device to be as close to the desired or defined length $L_D$ as possible. For example, the channel $L_c$ can be formed smaller or as small as possible. Since Rdson is directly proportional to the channel length $L_c$, a smaller L, results in lower Rdson. The L should be as small as possible (e.g., as close to $L_D$ as possible) to achieve the lowest Rdson. Furthermore, a well controlled $L_c$ results in improved performance uniformity, manufacturability and reliability. For example, Rdson on of less than 5 mOhm-mm$^2$ can be achieved for voltage application range of about 5-20 V. A low Rdson can also be achieved for higher voltage or other voltage ranges.

A drift well 116 is disposed in the substrate. The drift well, in one embodiment, is disposed in the transistor sub-region. For example, the drift region is disposed between inner edges and outer edges of the device isolation region and internal device isolation region. As shown, the drift well encompasses the drain and body regions of the transistor. In one embodiment, the depth or bottom of the drift well is below the drain region. In one embodiment, the depth of the drift well is below the drain and body regions. In one embodiment, the depth of the drift well is below a bottom of the STI regions.

The drift well, in one embodiment, is contiguous and encompasses the drain region and at least overlaps a portion of the body. In one embodiment, the drift well encompasses the drain portion and overlaps the portion of the body below the first sub-source portion. The drift well comprises first polarity type dopants. For example, the drift well comprises n-type dopants for a n-type device or p-type dopants for a p-type device. The drift well serves as a drift region of the device. The drift well may be lightly or intermediately doped with first polarity type dopants. The dopant concentration may depend on, for example, the maximum voltage requirement of the device.

In one embodiment, the transistor is a fully isolated transistor. The device includes first and second isolation wells 112 and 114 to isolate the device from the substrate. For example, the first and second isolation wells isolate the body and the drift well from the substrate. The first isolation well, for example, may be referred to as a deep device well and is disposed within the device isolation region 180a. As shown, the first isolation or deep device well is disposed within inner and outer edges 181a and 182a of the device isolation region. The deep device well comprises dopants of a first dopant polarity. The deep device well, in one embodiment, comprises the same dopant polarity as the device type. For example, a n-type deep device well is provided for a n-type device. The deep device well, for example, is a lightly doped well.

A deep well contact region 113 is disposed on a surface of the substrate. As shown, the deep well contact region is disposed between the device isolation region 180a and internal device isolation region 180b. The deep well contact region, for example, is a heavily doped with first polarity type dopants. The deep well contact region serves as a deep device or first isolation well bias terminal of the device.

The second isolation well is disposed within the first isolation well. The second isolation well, for example, may be referred to as a device body well 114. The device body well has second polarity type dopants. The device body well, for example, is disposed in the transistor sub-region of the device region. As shown, the device body well encompasses the drift well and is within inner and outer edges of the device isolation and internal device isolation regions. For example, the depth of the body well is between the drift well and deep device well. In one embodiment, the device body well has a lightly doped concentration of second polarity type dopants. For example, the device body well is lightly doped with p-type dopants for an n-type device or n-type dopants for a p-type device. Providing a device body well having other dopant concentration of second polarity type dopants may also be useful and may, for example, depend on the voltage isolation requirements of the device.

In one embodiment, a body connector 118 is provided. The body connector extends from a portion of the body to the second isolation or device body well. In one embodiment, the device body well extends from the body below the body contact 132 to the device body well. The body connector may be contiguous with the drift region. The body connector has second polarity type dopants. For example, the body connector contains the same polarity type dopants as the body region to provide a connection between the body contact and body to the device body well. The body connector may be lightly or intermediately doped with second polarity type dopants. The dopant concentration may depend on, for example, the maximum voltage requirement of the device.

The body contact (e.g., second sub-source) for example, serves as a second isolation or device body bias terminal of the device. The body bias terminal, for example, applies a bias voltage to bias the body and body well. The first and second isolation wells may be appropriately biased to isolate the device. For example, an appropriately biased second isolation well isolates the drift and drain regions from the substrate while appropriately biasing the first isolation well isolates the body and the first isolation well from the substrate.

In one embodiment, the source 131 and body contact 132 are coupled to a common signal, for example, the source signal. Alternatively, the source and body contact may be coupled to different signals. Furthermore, isolating the drain from the substrate reduces or prevents heavy substrate current flow due to undershooting of negative voltage applied to the drain. This avoids disturbances to neighboring circuitry caused by the heavy substrate current.

A substrate contact region 107 may be provided on a surface of the substrate. In one embodiment, the substrate contact region is disposed between the device isolation region and external isolation region. Providing the substrate contact region at other parts of the substrate may also be useful. The substrate contact region, in one embodiment, is a heavily doped region. The dopant type of the substrate contact region is the same type as the doped substrate. For example, the substrate doped region is p-type for a p-type doped substrate. The substrate contact region serves as a substrate bias terminal of the device. The substrate may be biased to ground (0V). Other bias voltages may also be useful. Biasing the substrate, for example, reduces latch-up and/or ground bounce during device operation.

In the case of a n-type devices, the first polarity type is n-type and the second polarity type is p-type. As for a p-type device, the first polarity type is p-type and the second polarity type is n-type.

Figure 1B:
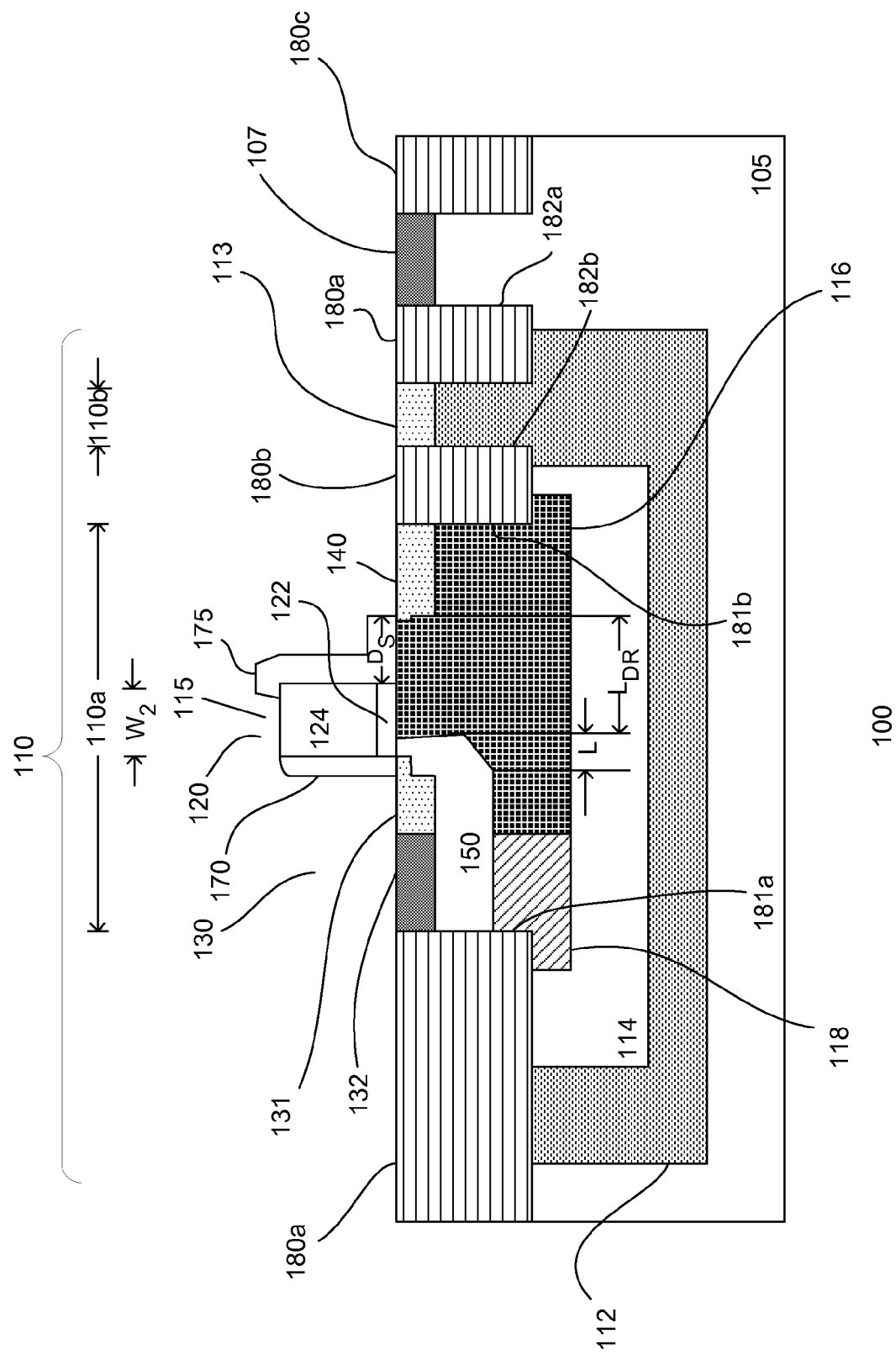

FIG. 1b shows a cross-sectional view of another embodiment of a device 100. The device is similar to that described in FIG. 1a. As shown, the drain side of the gate is provided with a salicide block spacer 175. The salicide block spacer comprises a dielectric material. For example, the dielectric material may be oxide, nitride, oxynitride or a combination thereof. Other types of dielectric materials may also be useful, for example, such as those compatible with semiconductor processing, for the salicide block spacers. In some embodiments, the block spacer may have multiple dielectric layers to form a dielectric stack or sandwich. The salicide block spacer provides a separation between the gate and the drain. The separation should be sufficient to accommodate the maximum operation voltage at the drain terminal. For example, the separation distance Ds may depend upon the maximum operating voltage at drain terminal. In one embodiment, the separation Ds is measured from the edge of gate to the heavily doped drain region. The separation distance $D_S$ may be about 0.3 μm to a couple of microns, depending upon maximum operating voltage at the drain. Providing other separation distances may also be useful. The salicide block spacer prevents silicidation of the drift region between gate electrode and the drain.

The Cgd of the device is mainly determined by the amount that the gate overlaps (gate overlap region) the drift region. By providing a salicide block spacer, the effective $L_{DR}$ can be increased for a given gate width. This allows for a narrower gate width to achieve the desired $L_{DR}$. For example, the gate width can be reduced or minimized, even for very high voltage applications, such as about 100 V. This reduces Cgd for a given $L_{DR}$. In effect, Qgg is also reduced. As such, the salicide block spacer enables a narrower gate to be used. For example, a gate with a salicide block spacer which has a width $W_2$, where $W_2<W_1$, can achieve a higher BVdss. For example, BVdss of greater than 15 V and very low Rdson and Cgd can be achieved with total gate width of as low as 0.3 μm. As such, advanced CMOS process may be employed to effectively produce a fully isolated device.

As described in FIGS. 1a-b, the body contact 132 and source region 131 (e.g., first sub-source) may be electrically connected by, for example, a common silicide contact. For example, both the body contact and source are coupled to the source signal or potential. In such cases, the source signal is used to bias the second isolation region. In other embodiments, the body contact and source region may be separate contact regions. For example, a surface block spacer or isolation region may be provided to separate the two contact regions, preventing a silicide contact to electrically connect both regions together. This may be useful to provide separate signals to the source and second isolation well. Independently biasing the source and second isolation well provides greater flexibility in operating and design parameters of the device.

Figure 1C:
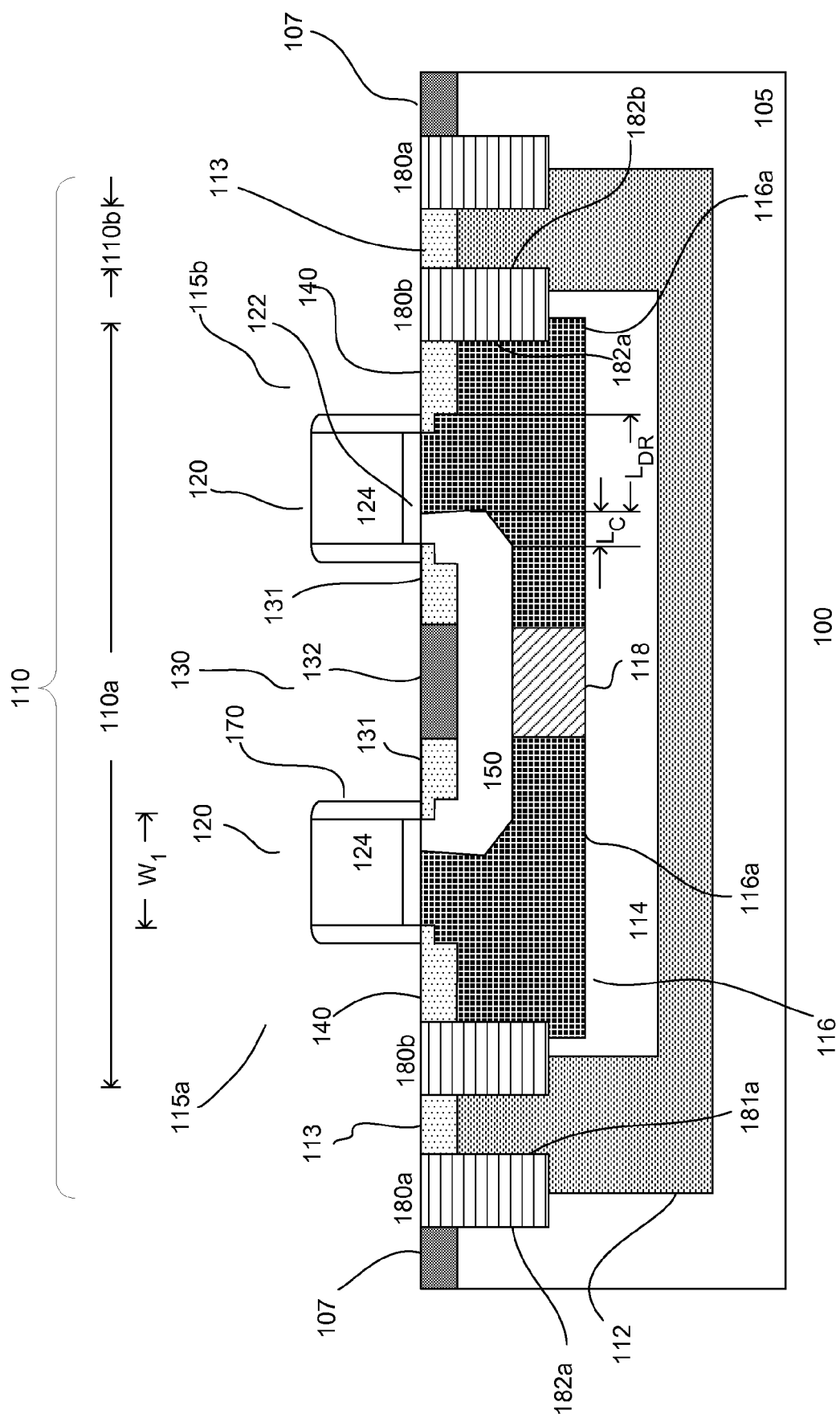

FIG. 1c shows a cross-sectional view of another embodiment of a device 100. The device includes similar elements as the device shown in FIG. 1a. As shown, a substrate is provided with a device isolation region 180a and an internal device isolation region 180b, such as STI regions. In one embodiment, the internal device isolation region 180b is concentrically disposed within the device isolation region, separating the device region into first and second sub-regions 110a and 110b. Other configurations of the isolation regions may also be useful, such as that described in FIG. 1a.

The first sub-region serves as a transistor region. In one embodiment, the transistor region includes a plurality of transistors. As shown, the device region includes first and second transistors 115a-b. The transistors are similar to that described in FIG. 1a. For example, the transistor includes a gate 120 having a gate electrode over a gate dielectric. Sidewall spacers 170 may be provided on sidewalls of the gate. The gate has, for example, a width $W_1$. A source region 130 and drain region 140 are disposed in the substrate on opposite sides of the gate. The source region includes first and second sub-source regions 131 and 132.

In one embodiment, a common source region is provided for the transistor pair. For example, the first sub-source regions are disposed adjacent to their respective gates with the second sub-source region between them. A drain region of a transistor is disposed between the internal device isolation region and the gate. The transistors may be arranged in other configurations. For example, the transistors may be configured with a common drain region and separate source regions. The first sub-source region serves as a source and the second sub-source region serves as a body contact.

A device body 150, in one embodiment, is provided between the transistors. The device body should extend to a sufficient depth to serve as a body of the transistor. For example, the device body extends to a depth of about 0.3 μm to a couple of microns. Other depths for device body may also be useful. As shown, the device body has a depth which is less than the depth of the STI regions. However, it is understood that the body may have other depths. The device body encompasses the common source region. The body extends beyond the common source region, under-lapping a portion of the gates. The portion of the body under-lapping the gates defines the channel of the transistors. The amount of under-lap $L_c$ defines a length of the channel of the transistors.

In accordance with one embodiment, the device body is a self-aligned device body. For example, the device body is self-aligned to common source region between the gates of the transistors. The self-aligned device body enables the under-lap portion $L_c$ to be smaller and well controlled. A smaller $L_c$ results in a lower Rdson. The $L_c$ should be as small as possible to achieve the lowest Rdson. The common second sub-source serves as a body contact to the device body.

A drain drift well 116 is disposed in the substrate. The drift well, in one embodiment, is disposed in the transistor sub-region. For example, the drift well is disposed between inner and outer edges 181b and 182b of the internal device isolation region. As shown, the drift well encompasses the source, drain and body regions of the transistors. In one embodiment, the depth or bottom of the drift well is below the drain region. In one embodiment, the depth of the drift well is below the drain region and device body. In one embodiment, the depth of the drift well is below a bottom of the STI regions.

The drift well comprises first polarity type dopants. For example, the drift well comprises n-type dopants for a n-type device or p-type dopants for a p-type device. The drift well serves as drift regions of the device, for example, between the body and the drain regions. The drift well may be lightly or intermediately doped with first polarity type dopants. The dopant concentration of the drift well may depend on, for example, the maximum voltage requirement of the device.

In one embodiment, a body connector 118 is provided. The body connector, for example is provided in the drift well, separating the drift well into first and second drift regions 116a. The body connector has second polarity type dopants. For example, the body connector contains the same polarity type dopants as the body region to provide a connection to the device body and body contact. The body connector may be lightly or intermediately doped with second polarity type dopants. The dopant concentration of the portions may depend on, for example, the maximum voltage requirement of the device.

In one embodiment, the device is a fully isolated device. For example, the body and the drift well are isolated from the substrate. In one embodiment, first and second isolation wells 112 and 114 are provided to isolate the device from the substrate. The first isolation well, for example, is a deep device well. The deep device well, for example, is disposed within the device isolation region 180*a*. As shown, the deep device well is disposed within inner and outer edges 181*a* and 182*a* of the device isolation region. The device well comprises dopants of the same polarity type as the drift regions.

Deep well contact regions 113 may be disposed on a surface of the substrate. As shown, a deep well contact region is disposed between the device isolation region 180*a* and internal device isolation region 180*b*. The deep well contact regions serve as a deep well bias terminals of the device. Although the device is shown with two deep well contact regions, providing other number of deep well contact regions, including 1, may also be useful.

The second isolation well 114 is disposed within the first isolation or deep device well. The second isolation well may be, for example, referred to as a device body well. The device body well has opposite polarity type dopants as first isolation and drift wells. The device body well, for example, is disposed in the transistor sub-region of the device region. As shown, the device body well encompasses the drift well and is within inner and outer edges of the internal device isolation region. The body connector couples the device body and the second sub-source region to the device body well. The second sub-source region, for example, serves as a second isolation or device body well bias terminal of the device.

Substrate contact regions 107 may be provided on a surface of the substrate. In one embodiment, the substrate contact regions are disposed outside of the device region. For example, they may be disposed between the device isolation region and external isolation regions (not shown). Providing the substrate contact regions at other parts of the substrate may also be useful. The substrate contact regions serve as substrate bias terminals of the device. Although the device is shown with two substrate contact regions, providing other number of substrate contact regions, including 1, may also be useful.

Figure 1D:
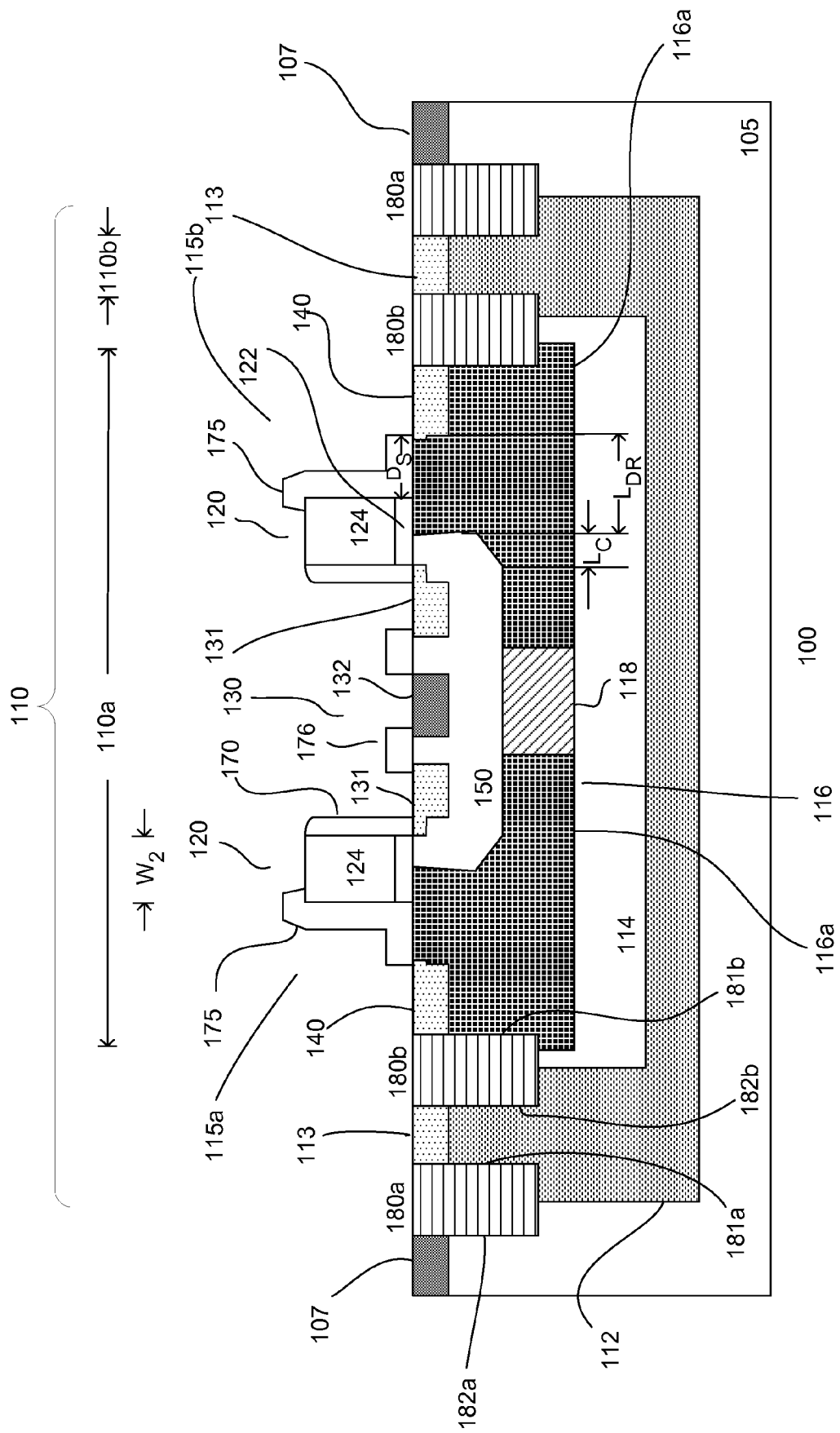

FIG. 1*d* shows a cross-sectional view of another embodiment of a device 100. The device is similar to that described in FIG. 1*c*. As shown, the drain side of the gates is provided with a salicide block spacer 175. The salicide block spacers comprise a dielectric material. For example, the dielectric material may be silicon oxide, nitride, oxynitride of a combination thereof. Other types of dielectric materials may also be used to for the salicide block spacers. In some embodiments, the block spacer may have multiple dielectric layers. A salicide block spacer provides a separation between a gate and its drain. The separation should be sufficient to withstand the desired maximum voltage at the drain. In one embodiment, the separation distance $D_S$ is about 0.4 μm to a couple of microns, for example, depending upon voltage of operation. Providing other separation distances may also be useful. The salicide block spacer prevents silicidation of the drift region between gate electrode and the drain.

The Cgd of the device is mainly determined by the amount that the gate overlaps (gate overlap region) the drift region. By providing a salicide block spacer, the effective $L_{DR}$ can be increased for a given gate width. This allows for a narrower gate width to achieve the desired $L_{DR}$. For example, the gate width can be reduced or minimized, even for very high voltage applications, such as about 100 V. This reduces Cgd for a given $L_{DR}$. In effect, Qgg is also reduced. As such, the salicide block spacer enables a narrower gate to be used. For example, a gate with a salicide block spacer which has a width $W_2$, where $W_2 < W_1$, can achieve a higher BVdss. For example, BVdss of greater than 15 V and very low Rdson and Cgd can be achieved with total gate width of as low as 0.3 μm. As such, advanced CMOS process may be employed to effectively produce a fully isolated device.

In some embodiments, surface spacers 176 may be provided on the source region. The surface spacers may be formed from a dielectric material. For example, the surface spacers may be formed from the same dielectric material as the salicide block spacers. The surface spacers facilitate separation of the source 131 and body contact 132. Providing a surface spacer may be useful, for example, to provide separate contact regions to bias the source and the body independently. For example, the source and body may be biased at different potentials.

The transistor pair of FIGS. 1*c-d* is configured with a common source region and separate drain regions. Alternatively, the transistor pair may be configured with a common drain region and separate source regions. Additionally, the transistor region may include other number of transistors. For example, any odd or even number of transistors may be provided. In the case of odd applications greater than or equal to 3, one or more transistor pairs may be provided an additional transistor, such as that described in FIGS. 1*a-b*. Embodiments having a plurality of transistors in the transistor sub-region employ a multi-finger configuration which facilitates high current drive with a compact layout. For example, a plurality of transistor structures can be configured in parallel to provide parallel fingers in which all sources are commonly coupled, all gate are commonly coupled and all drains are commonly coupled. Such an arrangement may be useful, for example, for high current applications, for example, from about hundreds of mA to about 40-50 A.

FIG. 1*c* shows an embodiment in which the source regions 131 and body contact 132 are common contact regions. For example, a silicide contact on the surface of the substrate connects both contact regions. In such cases, the source signal is used to bias to the second isolation well. Alternatively, as shown in FIG. 1*d*, the source regions and body contact are separate contact regions. For example, a surface spacer is used to separate the contact regions. An isolation region may also be used to separate the contact regions. Providing separate source and contact regions allows the second isolation well to be independently biased. Furthermore, the device of FIG. 1*c* may be provided with a surface spacer as described in FIG. 1*d*. In some embodiments, the device of FIG. 1*d* may have common source and body contacts as described in FIG. 1*c*.

Figure 2A:
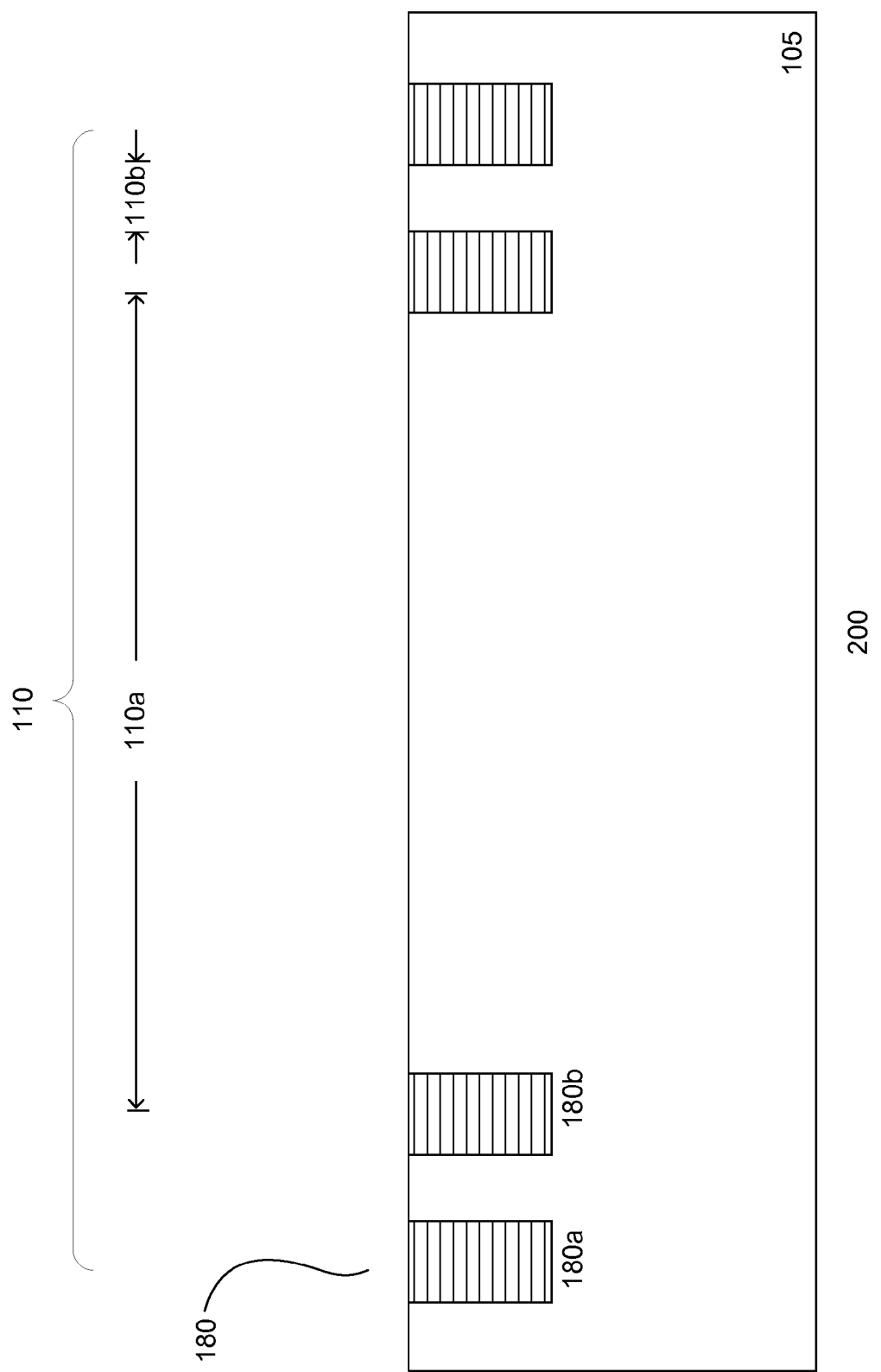
FIGS. 2*a-j* show cross-sectional views of a process of forming an embodiment of a device.

FIGS. 2*a-j* show cross-sectional views of an embodiment of a process 200 for forming a device or IC. Referring to FIG. 2*a*, a substrate 105 is provided. The substrate can comprise a silicon substrate, such as a lightly p-type doped substrate. Other types of substrates, including silicon germanium or silicon-on-insulator (SOI), are also useful.

As shown in FIG. 2*a*, a device region 110 is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

The device region is separated from other regions by a device isolation region 180*a*. The device isolation region surrounds the device region. In one embodiment, the device region also includes an internal device isolation region 180*b* to separate the device region into first and second device sub-regions 110*a-b*. The internal isolation region, for example, surrounds the first device sub-region. In one embodiment, the device isolation region and internal device isolation region are concentric isolation regions. For example, the second device sub-region completely surrounds the first device sub-region with them separated by the internal device isolation region. In other embodiments, the isolation regions are configured to provide a second device sub-region which partially surrounds the first device sub-region, such as on one, two or three sides. Other configurations of isolation regions may also be useful.

The isolation regions comprise, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. In other embodiments, the isolation may be other types of isolation regions. The depth of the STIs may be, for example, about 3000-4500 Å. Other depths for the STIs may also be useful. For example, the isolation regions may be DTI regions.

Figure 2B:
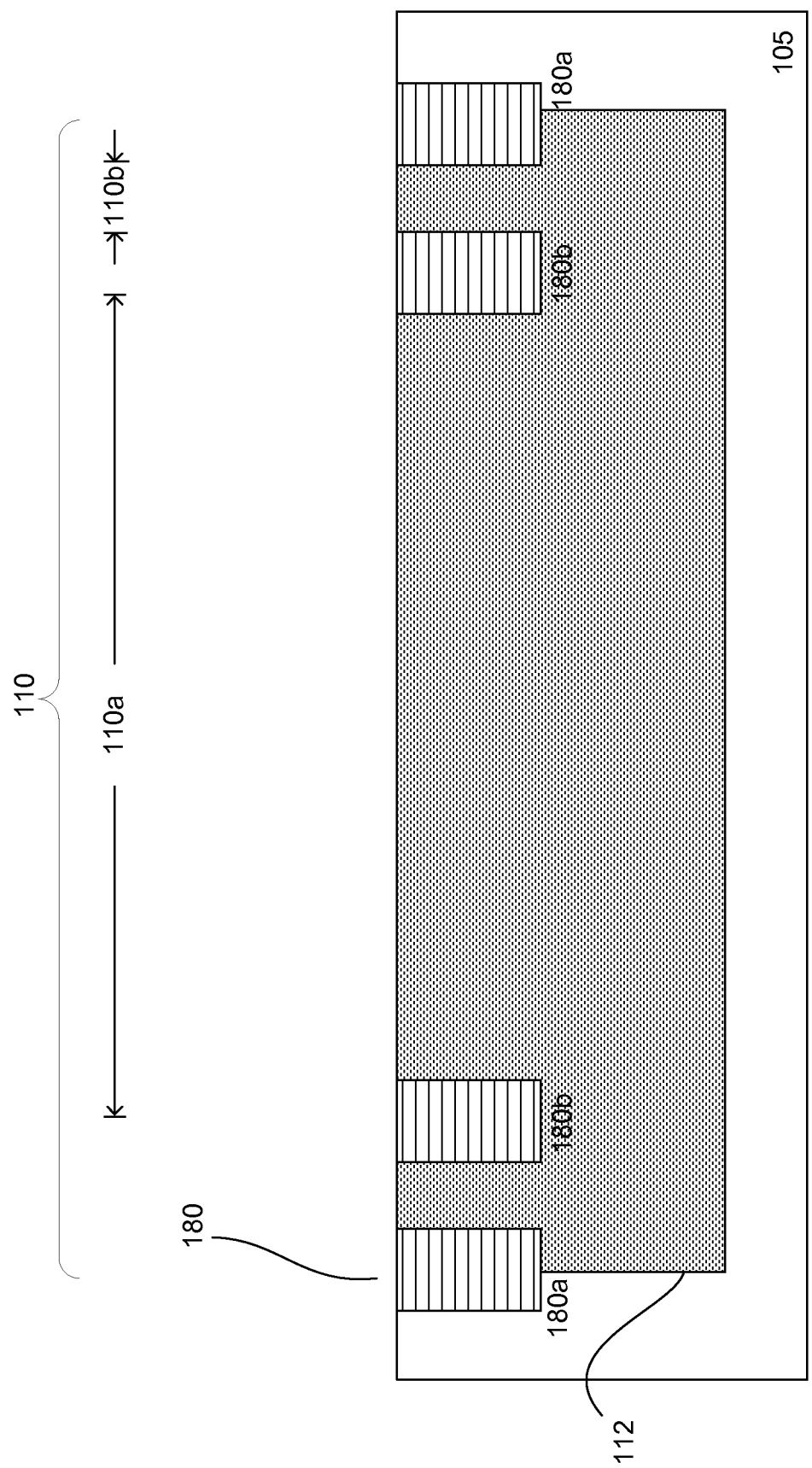

In FIG. 2*b*, a deep device well 112 is formed in the device region. The deep device well, for example, serves as first isolation well. The deep device well, in one embodiment, comprises dopants of the first polarity type. The deep device well may be lightly doped. The depth of the doped well, for example, may be about 2-10 μm. Such a depth, for example, may accommodate devices operating from about 10-100 V. Forming a deep device well having other depths may also be useful. The doped well may be formed by implanting appropriate dopants with the desired dose and power into the substrate. The dopant type, dose and power may depend on the type of device to be formed.

In one embodiment, the deep device well comprises a n-well for a n-type device. Forming a p-type deep device well for a p-type device may also be useful. The doped well may be formed by, for example, performing multiple implants at different energies. The implant process used to form the deep device well may be compatible with the process used to form, for example, high voltage wells. For example, the deep device well may be formed at the same time as the isolation wells for LV and HV devices. This allows the same lithographic mask to be used to pattern the implant mask. The lithographic mask used to form the LV and HV isolation wells, for example, may be customized to also include an opening for the deep device well. In other embodiments, a separate deep well mask may be used to specifically tailor the doping of the deep device well.

To form the deep device well, a deep well implant mask which exposes the device region is used. The implant mask, for example, comprises photoresist patterned by a lithographic mask. Since the device isolation region can serve as an implant mask, this allows for an increased processing window for the patterning process to form the implant mask. The implant mask may be removed after the deep well is formed. Other techniques for forming the deep device well may also be useful. For example, the deep device well may be formed by epitaxial silicon growth on a heavily doped N and P regions on the same substrate.

An anneal may be performed. The anneal, for example, diffuses the first type dopants from the implant, forming a deep device well which extends to under the bottom of the device isolation region. The anneal can be performed at a temperature of about 1000-1200° C. Other annealing temperatures and annealing parameters or processes may also be useful.

Figure 2C:
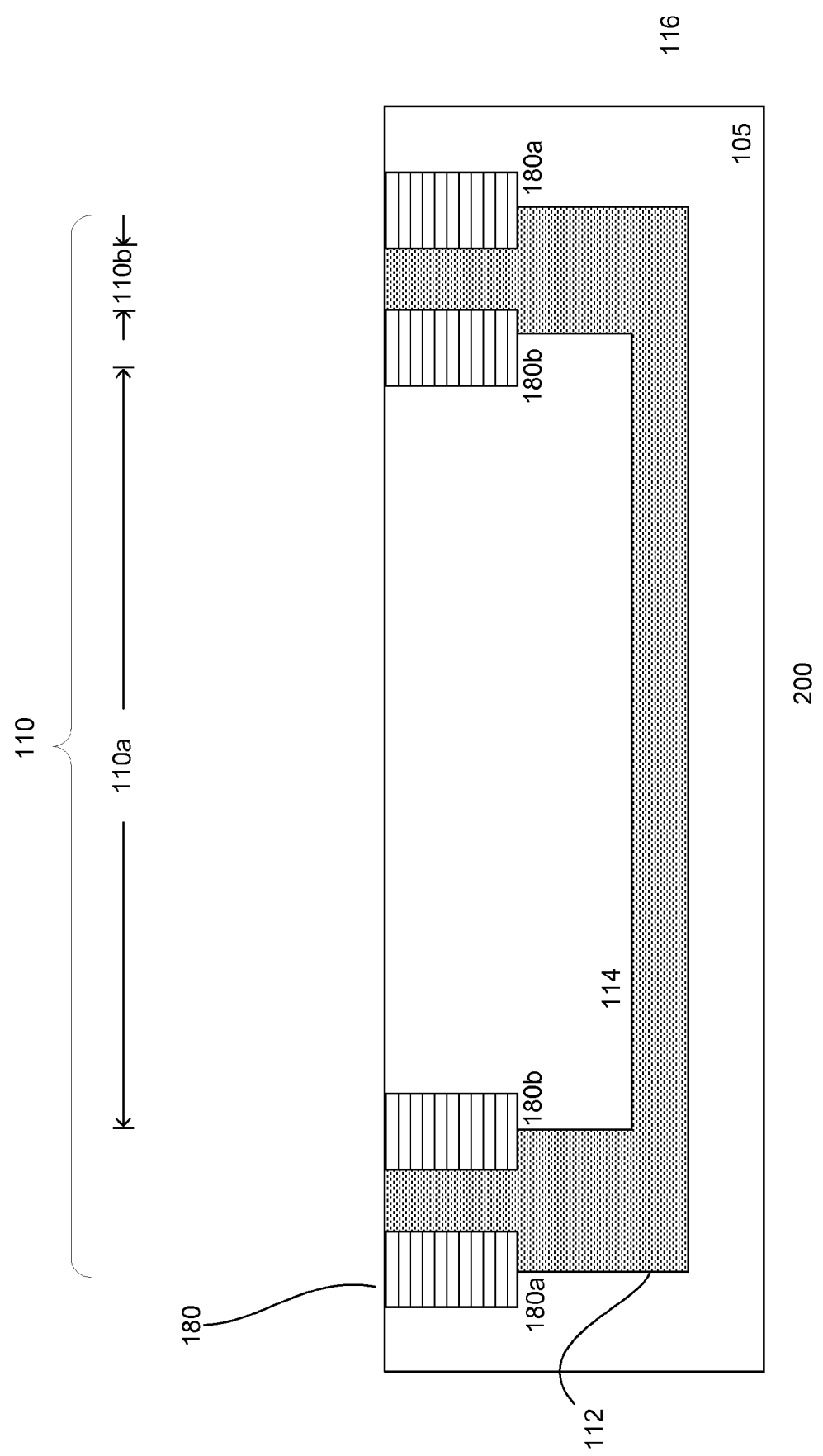

Referring to FIG. 2*c*, a body well 114 is formed in the first device sub-region. The body well, for example, serves as a second isolation well. The body well, in one embodiment, comprises dopants of the second polarity type. The body well is formed within the deep device well. In one embodiment, the body well is formed within the deep device well and within the first device sub-region. The depth of the body well, for example, may be about 1-8 μm range. Such a depth is useful for a device with a desired operating voltage from about 5-100 V. Providing a body well having other depths may also be useful and, for example, may depend on the desired operating voltage of the device. The body well may be formed by implanting appropriate dopants with the desired dose and power into the substrate. The dopant type, dose and power may depend on the type of device to be formed.

In one embodiment, the body well comprises a p-well for a n-type device. Forming a n-type body well for a p-type device may also be useful. The doped well may be formed by performing multiple implants at different energies. The implant process used to form the body well may be compatible with the process used to form a high voltage doped well. For example, the body well may be formed at the same time as the high voltage second polarity type doped well. This allows the same lithographic mask to be used to pattern the implant mask. The lithographic mask used to form the high voltage second polarity type doped well, for example, may be customized to include the body well opening. In other embodiments, a separate body well mask may be used to specifically tailor the doping of the deep well.

To form the body well, a body well implant mask which exposes the first device sub-region is used. The implant mask, for example, comprises photoresist patterned by a lithographic mask. Since the internal device isolation region can serve as an implant mask, this allows for an increased processing window for the patterning process to form the implant mask. The implant mask may be removed after forming the body well. Other techniques for forming the body well may also be useful.

An anneal may be performed. The anneal diffuses the second type dopants, forming a body well which extends to under the bottom of the internal device isolation region. The anneal, for example, is performed at a temperature of about 1000-1200° C. for about 1-15 hours. Alternatively, the anneal may be a rapid thermal anneal (RTA). Other annealing parameters or processes may also be useful.

As described, the isolation wells are formed after the isolation region is formed. In other embodiments, the isolation wells may be formed prior to forming the isolation regions.

Figure 2D:
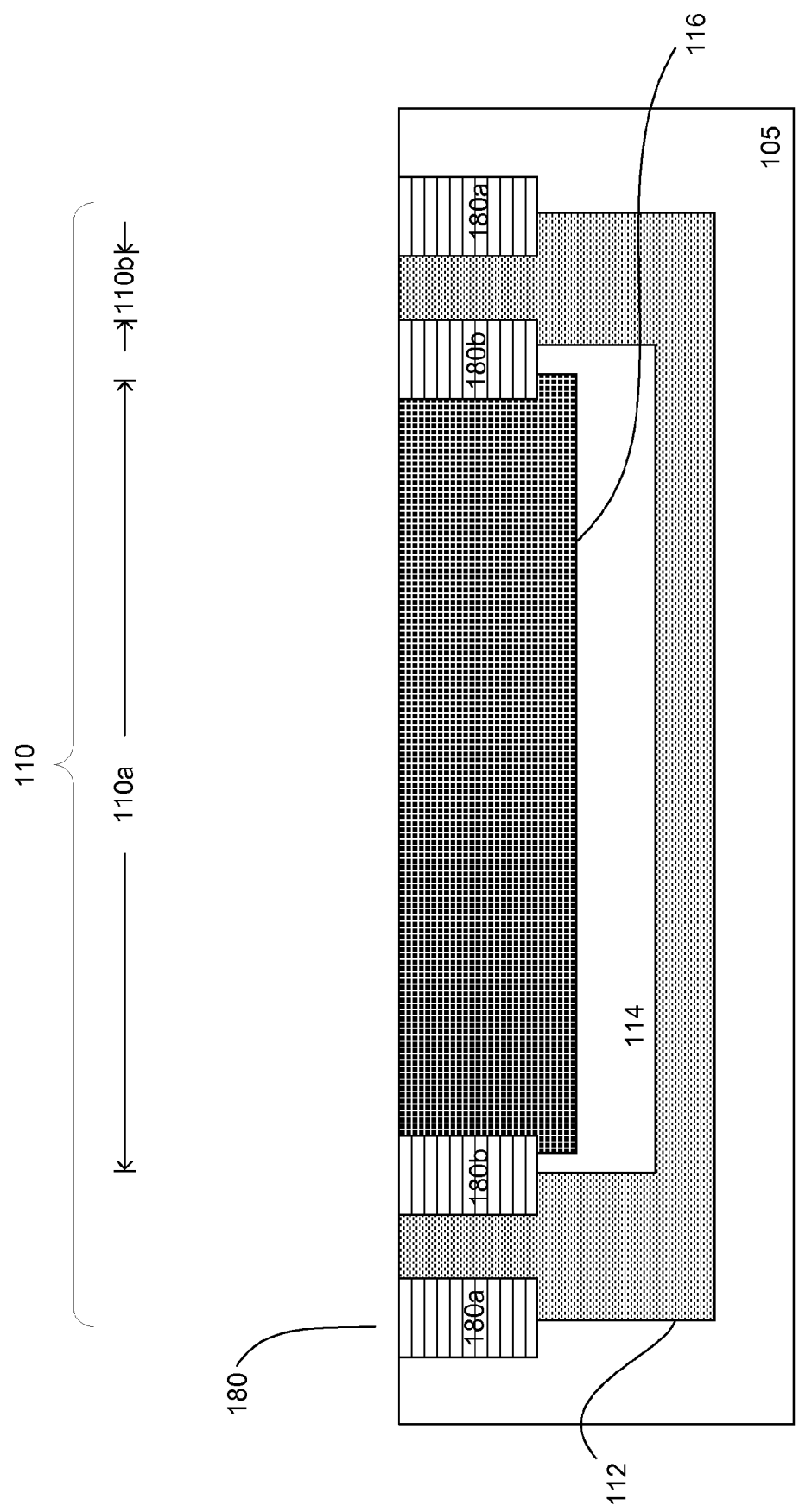

Referring to FIG. 2*d*, a drift well 116 is formed in the first device sub-region. The drift well, in one embodiment, comprises dopants of the first polarity type. The drift well is formed within the body well. In one embodiment, the drift well is formed within the body device well and within the first device sub-region. In one embodiment, the depth or bottom of the drift well is below the drain region. In one embodiment, the depth of the drift well is below the drain and body regions. In one embodiment, the depth of the drift well is below a bottom of the STI regions. Providing a drift well having other depths may also be useful. The drift well may be formed by implanting appropriate dopants with the desired dose and power into the substrate. The dopant type, dose and power may depend on the type of device to be formed.

In one embodiment, the drift well comprises a n-well for a n-type device. Forming a p-type drift well for a p-type device may also be useful. The drift well may be formed by implanting ions into the first device sub-region. The implant process used to form the drift region may be compatible with the process used to form a low voltage doped well. For example, the shallow device well may be formed at the same time as the low voltage first polarity type doped well. This allows the same lithographic mask to be used to pattern the implant mask. The lithographic mask used to form the low voltage first polarity type doped well, for example, may be customized to include the shallow device well opening. In other embodiments, a separate shallow well mask may be used to specifically tailor the doping of the drift well.

To form the drift well, an implant mask which exposes the first device sub-region is used. The implant mask, for example, comprises photoresist patterned by a lithographic mask. Since the internal device isolation region can serve as an implant mask, this allows for an increased processing window for the patterning process to form the implant mask. Other techniques for forming the deep device well may also be useful. Alternatively, the implant may be tailored specifically to form the drift well.

Figure 2E:
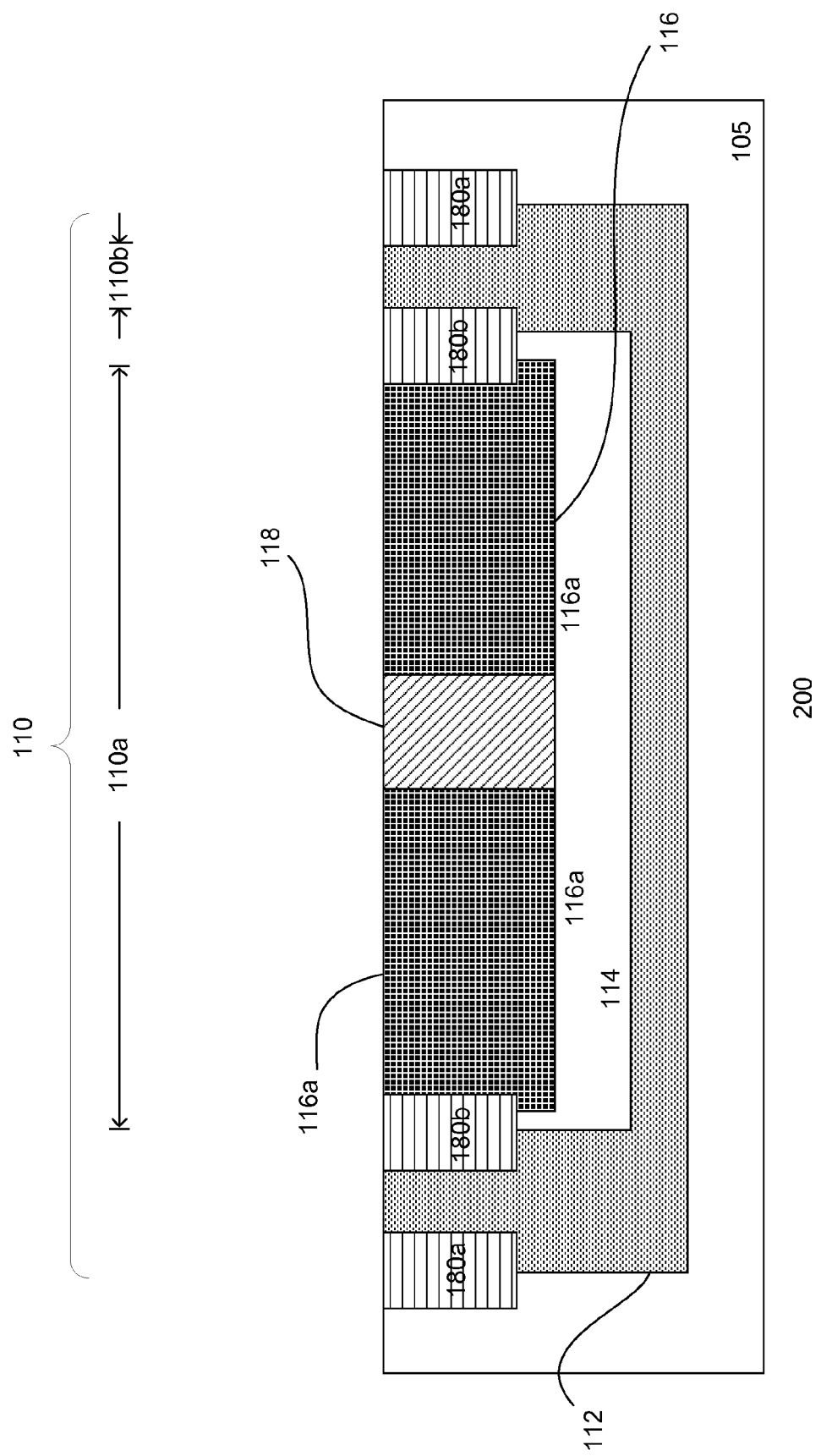
Figure 2F:
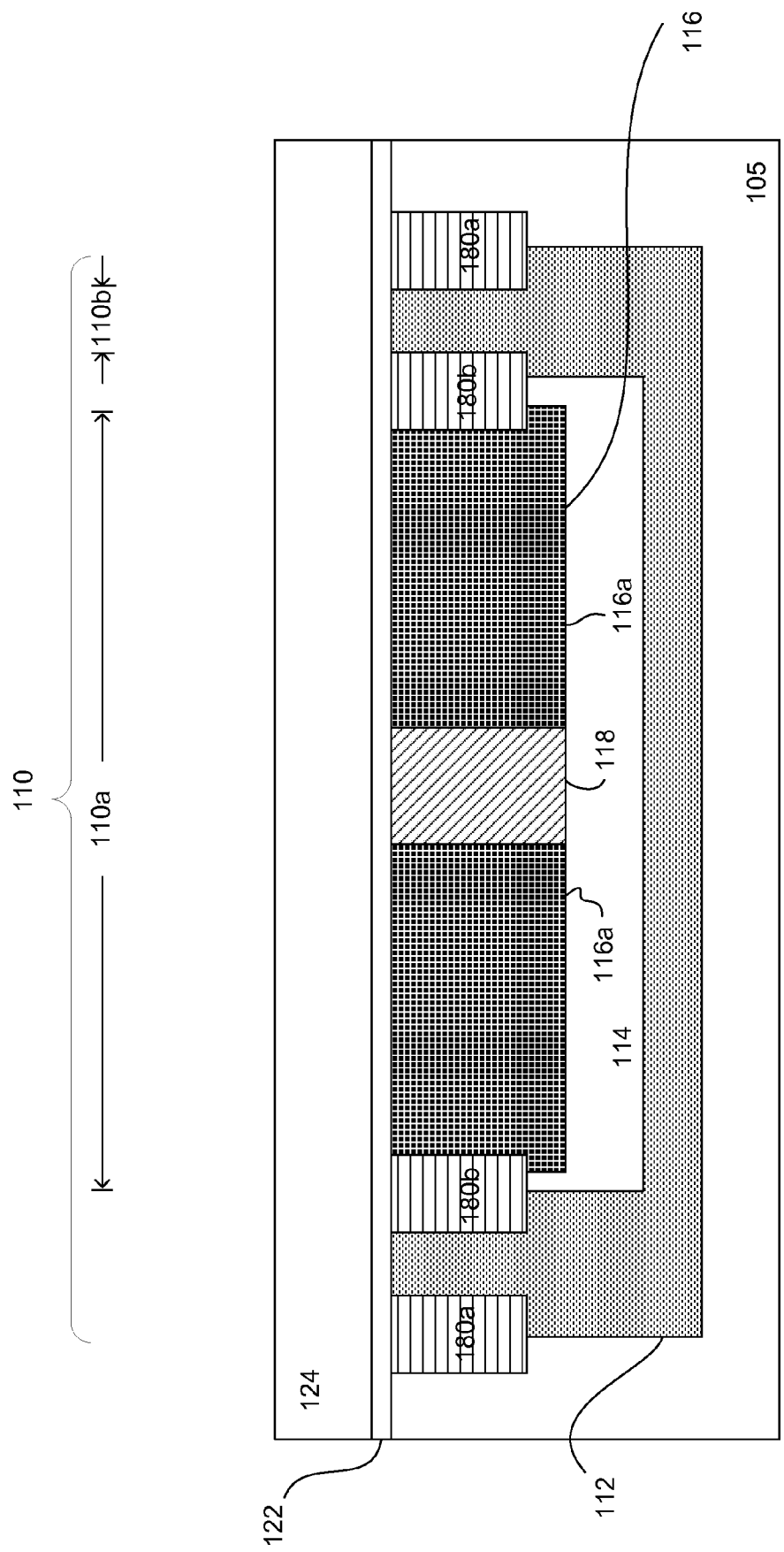

Referring to FIG. 2e, a body connector 118 is formed in the first device sub-region. The body connector comprises dopants of the second polarity type. The body connector, for example, forms a connection with the body well 114. As shown, the body connector separates the two drift well into two separate drift regions 116a. The body connector may be formed by implanting appropriate dopants with the desired dose and power into the substrate. The dopant type, dose and power may depend on the type of device to be formed.

In one embodiment, the body connector comprises p-type dopants. The body connector may be formed by implanting ions into a portion of the shallow device region. The implant process used to form the body connector may be compatible with the process used to form a low voltage doped well. For example, the body connector may be formed at the same time as the low voltage second polarity type doped well. This allows the same lithographic mask to be used to pattern the implant mask. The lithographic mask used to form the low voltage second polarity type doped well, for example, may be customized to include the body connector opening. In other embodiments, a separate body connector mask may be used to specifically tailor the doping of the body connector.

To form the body connector, a body connector implant mask which exposes the portion of the first device sub-region is used. The implant mask, for example, comprises photoresist patterned by a lithographic mask. The implant mask may be removed after forming the body connector In FIG. 2f, gate layers are formed on the substrate. In one embodiment, a gate dielectric layer 122 is formed on the surface of the substrate. The gate dielectric layer, for example, comprises silicon oxide. Other types of dielectric materials may also be useful. In one embodiment, the gate dielectric layer comprises a thick gate dielectric layer. The thickness of the gate dielectric layer may be about 20-1000 Å. For example, the thickness of the gate dielectric layer may be about 20 Å for Vgs of about 1.2V and increase to about 1000 Å for Vgs of about 40-60 V. Other gate dielectric layer thicknesses may also be useful. The gate dielectric layer may be formed by thermal oxidation. For example, the dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Other types of gate dielectric materials or thicknesses may also be useful. For example, the gate dielectric material may comprise other types of gate dielectric materials and/or be formed by other types of processes, such as chemical vapor deposition (CVD).

In one embodiment, the gate dielectric layer is formed using multiple processes. Each process forms a portion of a gate dielectric layer until the desired thickness is achieved. For example, the gate dielectric layer is formed by first and second processes. The first process forms a gate dielectric layer for LV devices while the second process increases the thickness of the dielectric layer for LV devices to that of HV devices. Forming the gate dielectric layer using other number of processes may also be useful. This facilitates compatibility of processes used in forming ICs having multi-voltage devices.

A gate electrode layer 124 is formed on the substrate over the gate dielectric layer. The gate electrode layer comprises, in one embodiment, polysilicon. The gate electrode layer can be formed as an amorphous or non-amorphous layer. The gate electrode may be doped. Various techniques may be employed to dope the gate electrode, for example, in-situ doping or ion implantation. Other types of gate electrode materials may also be useful. For example, a metallic material may be used to form a metal gate electrode. The thickness of the gate electrode layer may be about 800-3000 Å. Other thicknesses may also be useful. To form the gate electrode layer, techniques such as chemical vapor deposition (CVD), can be used. Other techniques may also be useful.

Figure 2G:
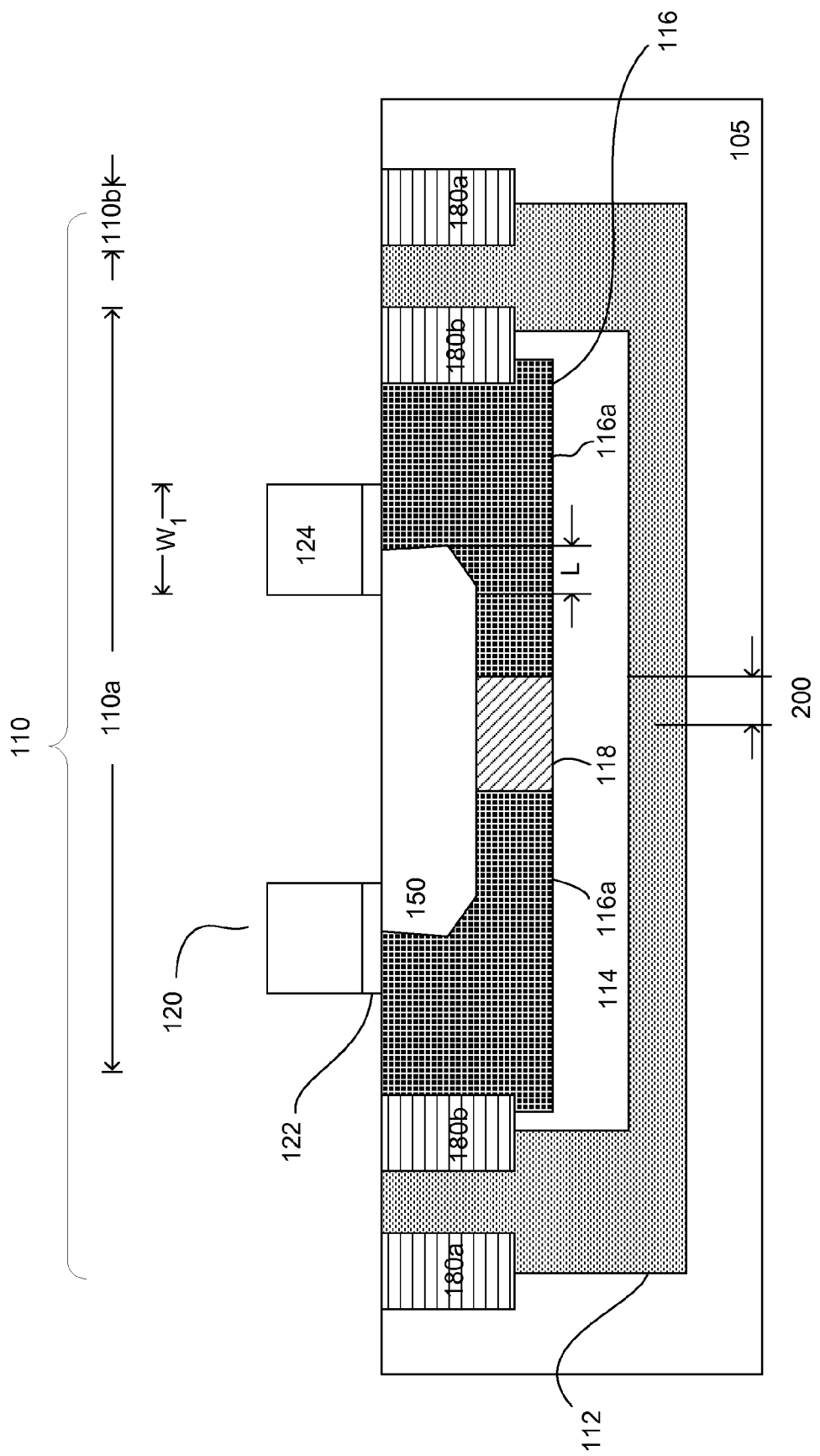

In FIG. 2g, the gate layers are patterned to form one or more gates. As shown, the gate layers are patterned to form first and second gates 120 corresponding to first and second transistors in the transistor sub-region. A gate includes a gate electrode layer 124 over a gate dielectric layer 122 and has a width $W_1$. Patterning the gate layers to form other number of gates in the transistor sub-region is also useful. Techniques, such as mask and etch processes, can be used. For example, a photoresist layer is formed over the gate electrode layer and patterned, exposing portions of the gate electrode layer. An anisotropic etch, such as a RIE, is performed to remove exposed portions of the gate electrode layer and gate dielectric layer below. To improve lithographic resolution, an anti-reflective coating (ARC) can be provided beneath the photoresist. Other techniques for patterning the gate layers may also be useful.

A body 150 is formed in the transistor sub-region. The body is formed in source regions of the transistors. In one embodiment, the body is formed in a common source region between the gates. The body is formed by, for example, implanting second polarity type dopants in the common source region. P-type dopants may be implanted to form a body for a n-type device. On the other hand, n-type dopants may be implanted to form a p-type device.

To form the body, a body implant mask may be used. The body implant mask, for example, comprises photoresist. The implant mask may be patterned to expose the source region of a transistor. For example, the implant mask may be patterned to expose the common source region of the transistors. To improve lithographic resolution, an ARC layer may be provided below the photoresist. The implant, for example, is self-aligned to the gates. In other embodiment, the implant may be self-aligned to a gate and an isolation region. As such, the body is a self-aligned body. Forming a self-aligned body allows for an increased processing window for the patterning process to form the body implant mask.

The implant forms a body having a desired depth and under-lap L. The depth of the body, for example, is about 0.3 µm to couple microns. The depth, for example, may depend on the device voltage operation requirements. The under-lap L should be sufficiently small to achieve the desired Rdson. For example, the under-lap should be as small as possible to achieve as low Rdson as possible. The under-lap L, in one embodiment, is about 0.2 µm to couple of microns for voltage ranging from about 5-7 V to about 100 V.

In one embodiment, the body is formed by a tilt implant. For example, a quad tilt implant is performed. The quad tilt implant, for example, includes four implants perform at a tilt, each rotated by 90°. The tilt angle of the quad tilt implant may be about 7-45°. In one embodiment, the tilt angle of the quad tilt implant may be about 45°. Other tilt angles may also be useful, depending on the desired under-lap L. The dose of the implant may be from about $1E12/cm^2$-$5E14/cm^2$ and the implant energy may be from about 20-30 KeV to hundred's of KeV. Other implant parameters may also be useful and may depend on, for example, desired depth and L. After the body is formed, the body implant mask is removed.

Figure 2H:
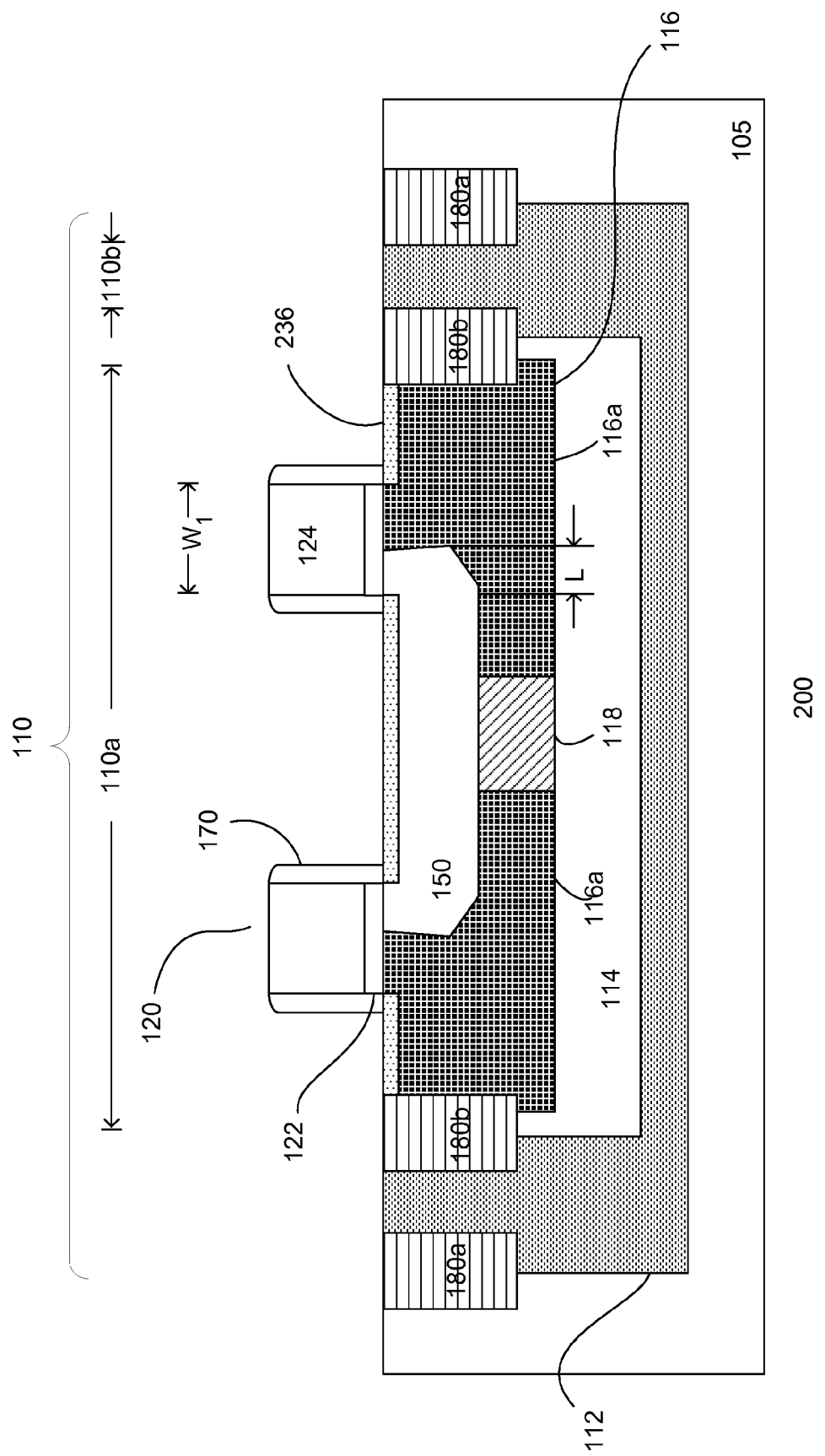

In one embodiment, lightly doped drain (LDD) regions 236 are formed on the substrate in the drain and source regions of the transistors, as shown in FIG. 2h. In one embodiment, the LDD regions are lightly doped regions having first polarity type dopants. The depth of the LDD regions, for example, is about 0.05-0.3 µm. A LDD implant mask may be used to implant dopants to form the LDD regions. The LDD implant mask, for example, comprises photoresist. The implant mask may be patterned to expose the source and drain regions of the transistors. To improve lithographic resolution, an ARC layer may be provided below the photoresist. The implant, for example, is self-aligned to the gates and isolation region. For example, the implant may be self-aligned to the gates and internal device isolation regions. This increases the processing window for the patterning process to form the LDD implant mask. The implant dose may be from about $1E12$ $cm^2$-$5E14/cm^2$ and the implant energy may be from a few hundred eV to about 200 KeV. Other implant parameters may also be useful.

Sidewall spacers 170 are formed on the sidewalls of the gates. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, about 100-2000 Å. Other thicknesses for the dielectric layer may also be useful. The thickness, for example, may depend on the desired width of the spacers. An anisotropic etch, such as a RIE, may be performed to remove horizontal portions of the dielectric layer, leaving spacers on the sidewalls of the gate. In some applications, the spacer may be formed from multiple dielectric layers.

Figure 2I:
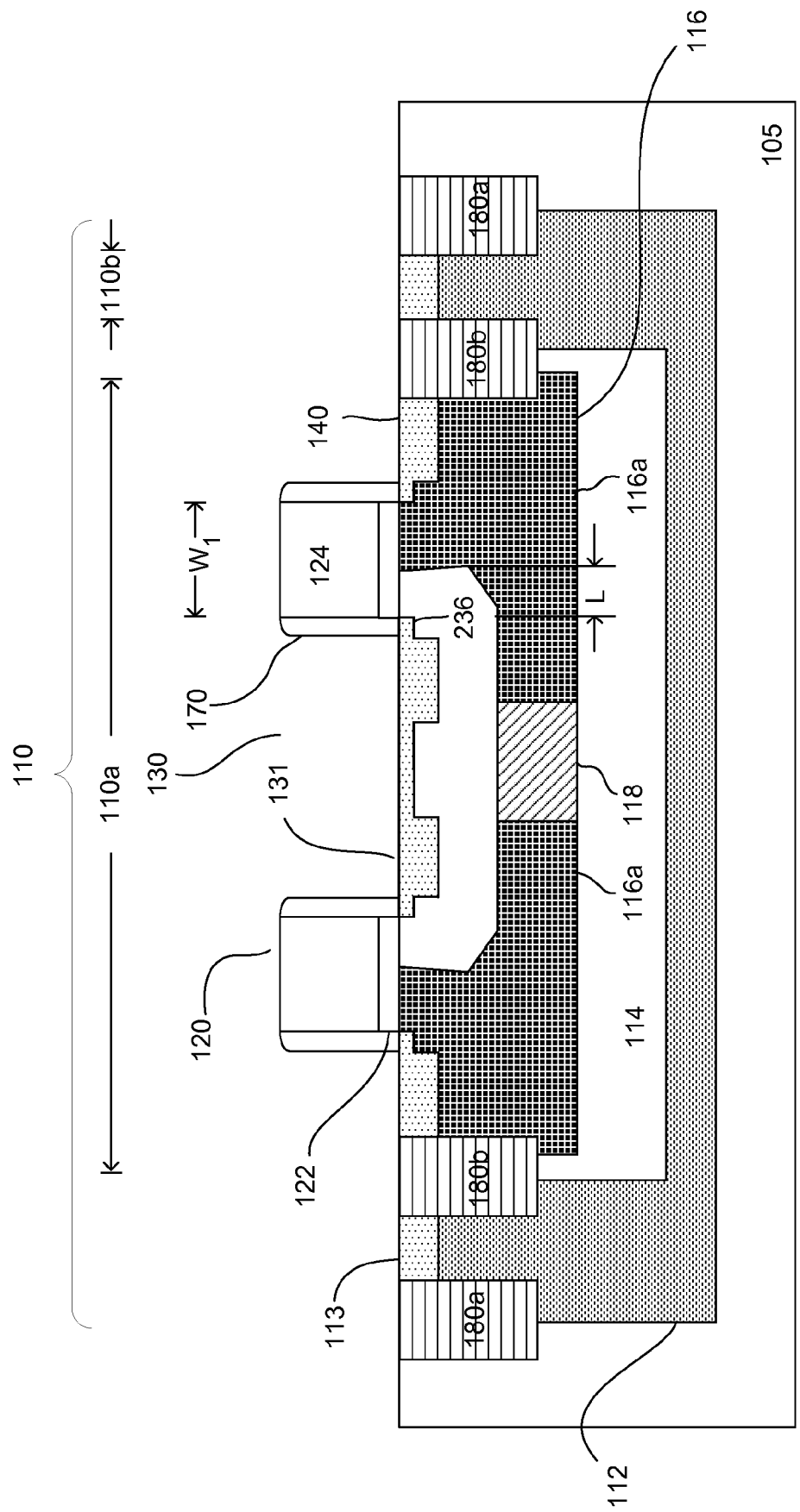

In FIG. 2i, a common source region 130 and drain regions 140 are formed on the substrate. The common source region includes a first sub-source region 131 and a second-sub source region. In one embodiment, the process for forming the first sub-source and drain regions also forms deep device well contact regions 113. The first sub-source, drain and deep well contact regions are heavily doped regions having first polarity type dopants. The depth of the first sub-source, drain and deep well contact regions, for example, is about 0.05-0.5 µm. A first S/D implant mask may be used to implant dopants to form the different doped regions. The first S/D implant mask, for example, comprises photoresist. The implant mask may be patterned to expose the first sub-source and drain regions of the transistors. To improve lithographic resolution, an ARC layer may be provided below the photoresist. The implant, for example, is self-aligned to the gates and isolation regions with a portion covering the second sub-source region.

For example, the implant may be self-aligned to the gates, device isolation region and internal device isolation region with a portion covering the second sub-source region. This increases the processing window for the patterning process to form the first S/D implant mask. The dose of the implant may be, for example, from about $1E15$ $cm^2$-$2E16/cm^2$ and the implant energy may be from about a few hundred eV to about 200 KeV. Other implant parameters may also be useful.

In some embodiments, the implant may comprise a tilt implant. In such cases, an LDD implant may be dispensed with since the tilt implant may be used to for the LDD extensions and first sub-source and drain regions.

Figure 2J:
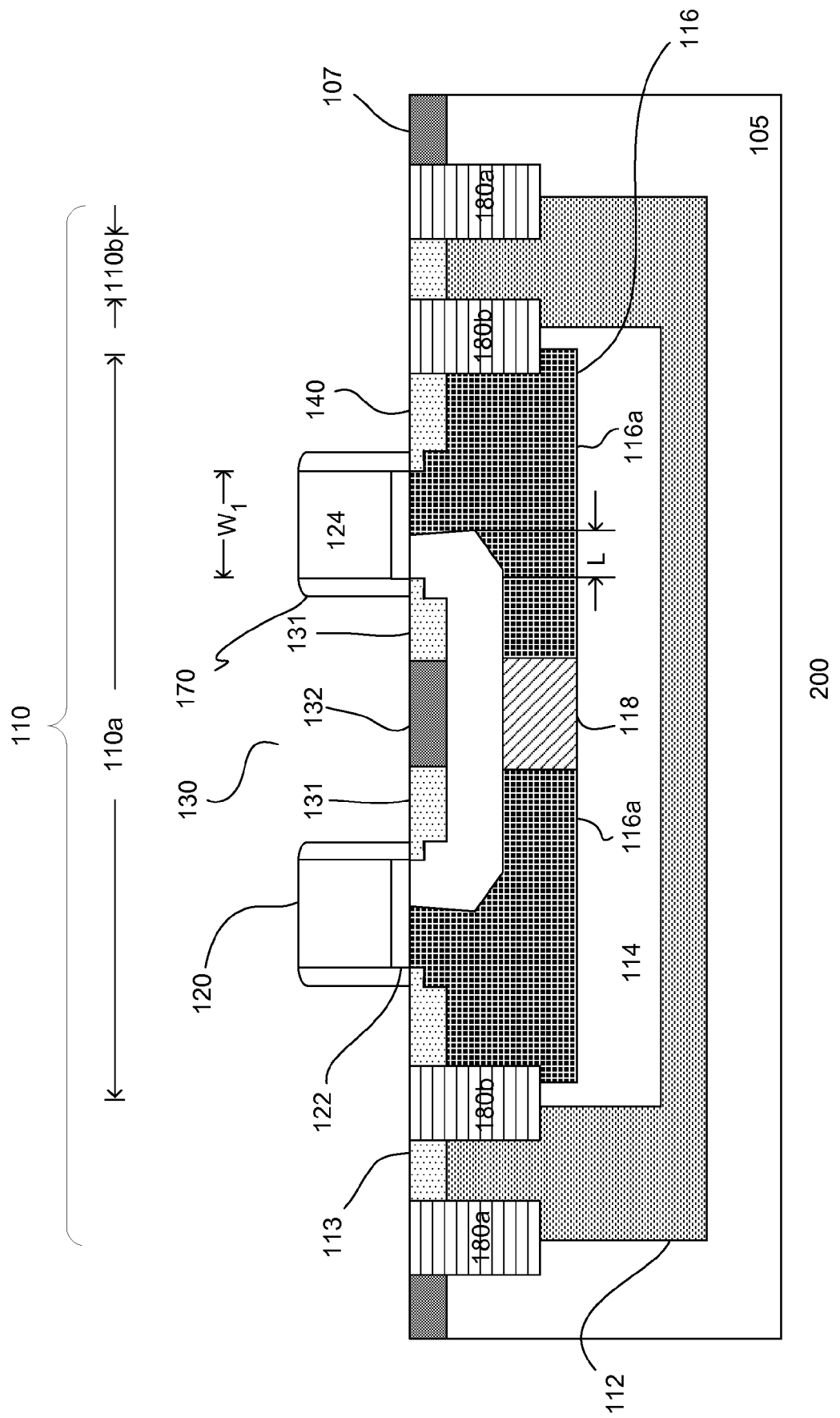

Referring to FIG. 2j, a second sub-source region 132 is formed. In one embodiment, the process for forming the second sub-source region also forms substrate contact regions 107. The second sub-source and substrate contact regions are heavily doped regions having second polarity type dopants. The depth of the second sub-source and substrate contact regions, for example, is about 0.05-0.5 µm. The second sub-source region serves as a body contact to the device body. A second S/D implant mask may be use to implant dopants to form the different doped regions. The second S/D implant mask, for example, comprises photoresist. The dose of the implant may be, for example, from about $1E15$ $cm^2$-$2E16/cm^2$ and the implant energy may be from about a few hundred eV to about 200 KeV. Other implant parameters may also be useful.

In other embodiments, the first S/D implant mask may be used to form the body contact along with appropriate contact regions while the second S/D implant mask may be used to form the source and drain regions along with appropriate contact regions.

In some embodiments, the first and second sub-source regions are separate regions. For example, a surface spacer or isolation region may be provided to separate the first and second sub-source regions. Separate first and sub-source regions may be useful for independent biasing the second isolation well.

The process continues to form the device. For example, the additional processing can include forming silicide contacts on the various contact regions and the surface of the gate electrode. The process further continues to form a PMD layer and contacts to the terminals of the cell. Additional processes may include forming of one or more interconnect levels, final passivation, dicing, assembly and packaging. Other processes are also useful. For example, other components, such as low voltage, medium voltage, and high voltage I/O devices can be formed prior to forming the interconnections.

Figure 3A:
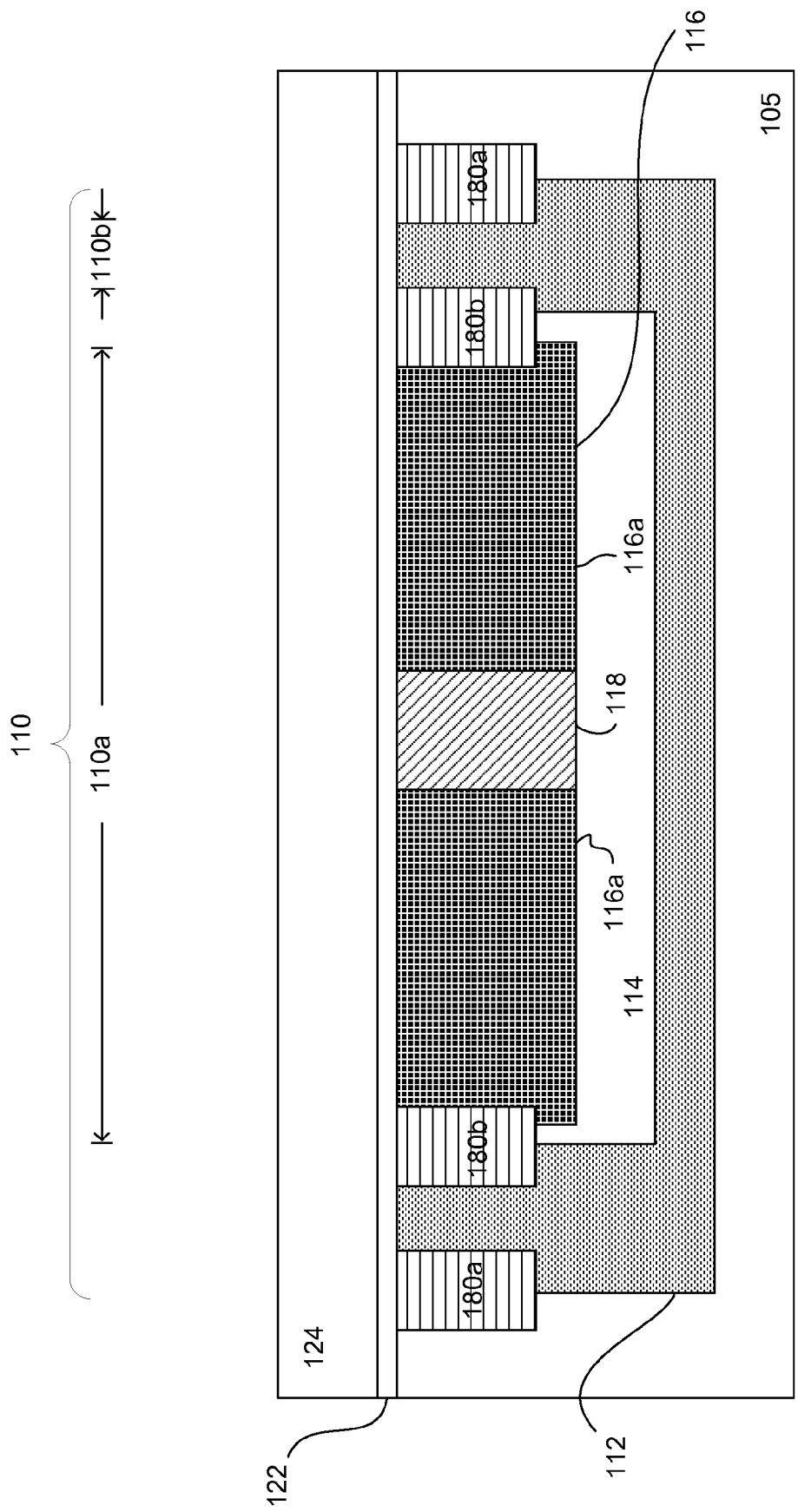
FIGS. 3*a-f* show cross-sectional views of a process of forming another embodiment of a device.

FIGS. 3a-f show a process for forming another embodiment of a device 300. Referring to FIG. 3a, a partially prepared substrate 105 is shown. The partially prepared substrate is at a stage of processing as described in FIG. 2f. For example, the substrate includes gate layers 122 and 124 formed on a substrate prepared with isolation regions 180a-b and various doped wells and doped regions 112, 114, 116 and 118.

Figure 3B:
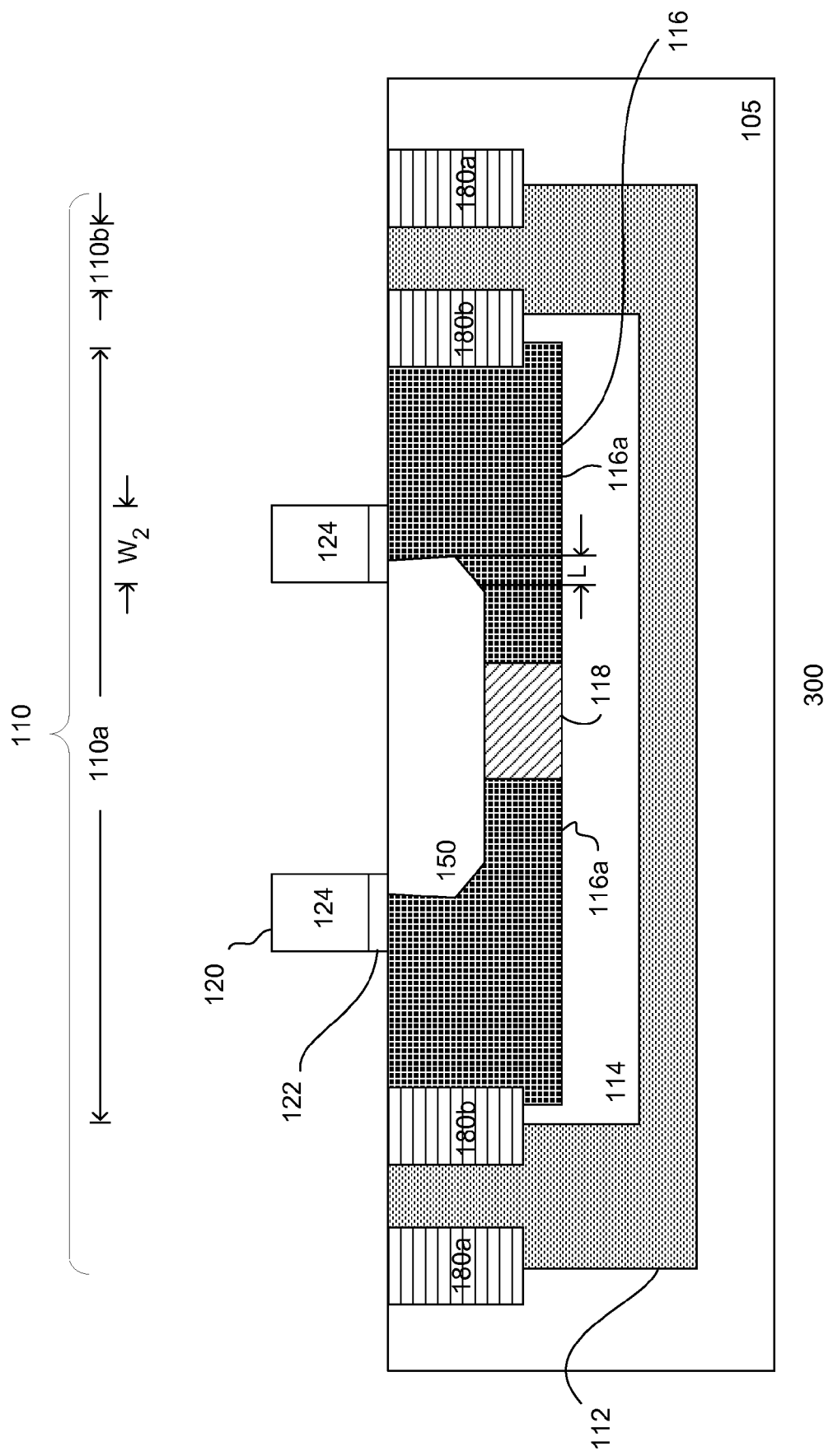

In FIG. 3b, the gate layers are patterned to form one or more gates. As shown, the gate layers are patterned to form first and second gates 120 corresponding to first and second transistors in the transistor sub-region. A gate includes a gate electrode layer 124 over a gate dielectric layer 122 and has a width $W_2$. In one embodiment, $W_2 < W_1$. For example, $W_2$ is equal to about 0.4-2 µm.

A body 150 is formed in the transistor sub-region. The body is formed in source regions of the transistors. In one embodiment, the body is formed in a common source region between the gates. The body is formed by, for example, implanting second polarity type dopants in the common source region. P-type dopants may be implanted to form a body for a n-type device. On the other hand, n-type dopants may be implanted to form a p-type device.

Figure 3C:
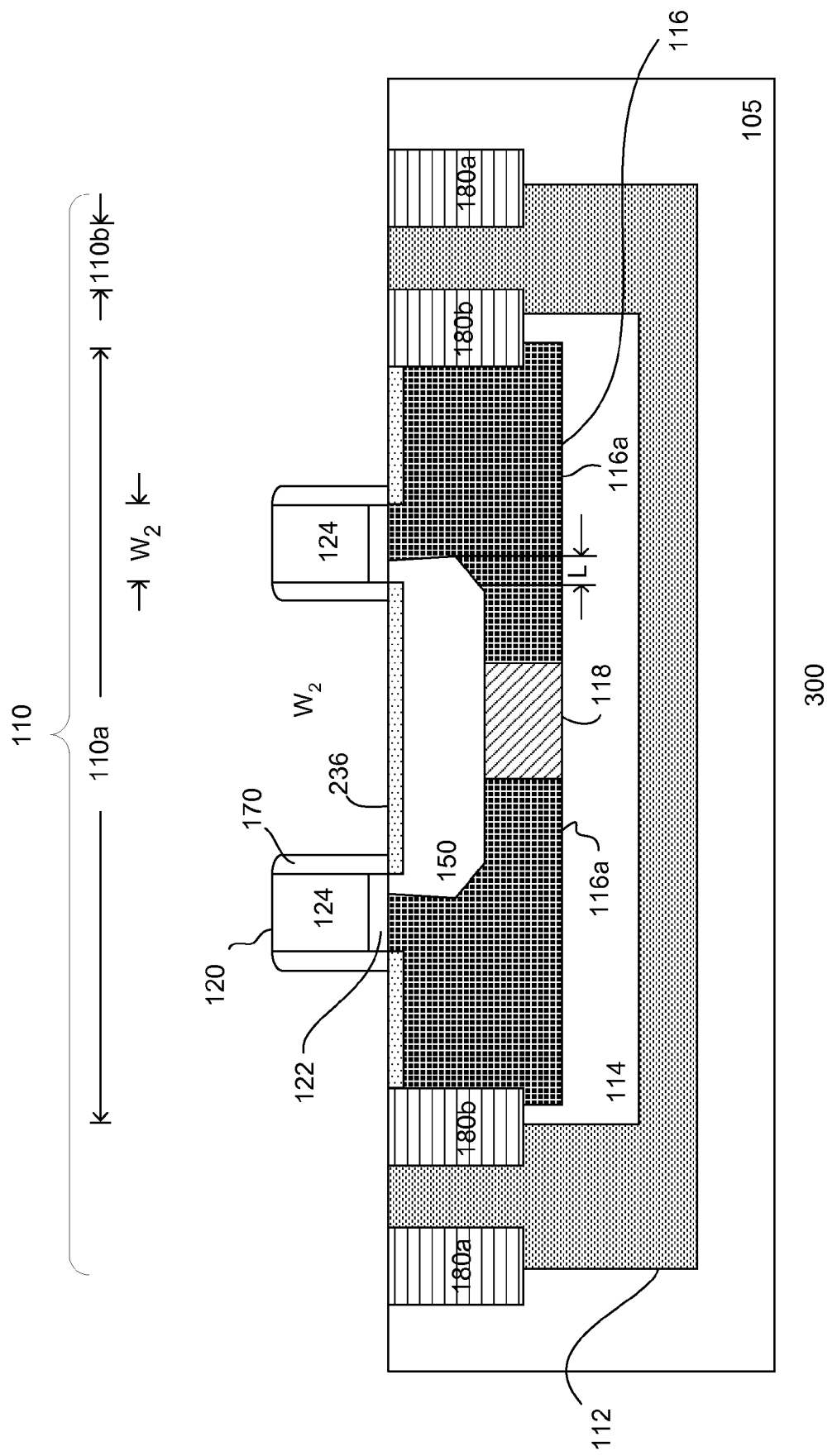

Referring to FIG. 3c, lightly doped drain (LDD) regions 236 are formed on the substrate in the drain and source regions of the transistors. In one embodiment, the LDD regions are lightly doped regions having first polarity type dopants. The depth of the LDD regions, for example, is about 0.1-0.5 μm. Sidewall spacers 170 are formed on the sidewalls of the gates. The sidewall spacers 170, for example, may be silicon oxide. Other types of dielectric material, such as silicon nitride, may also be used.

Figure 3D:
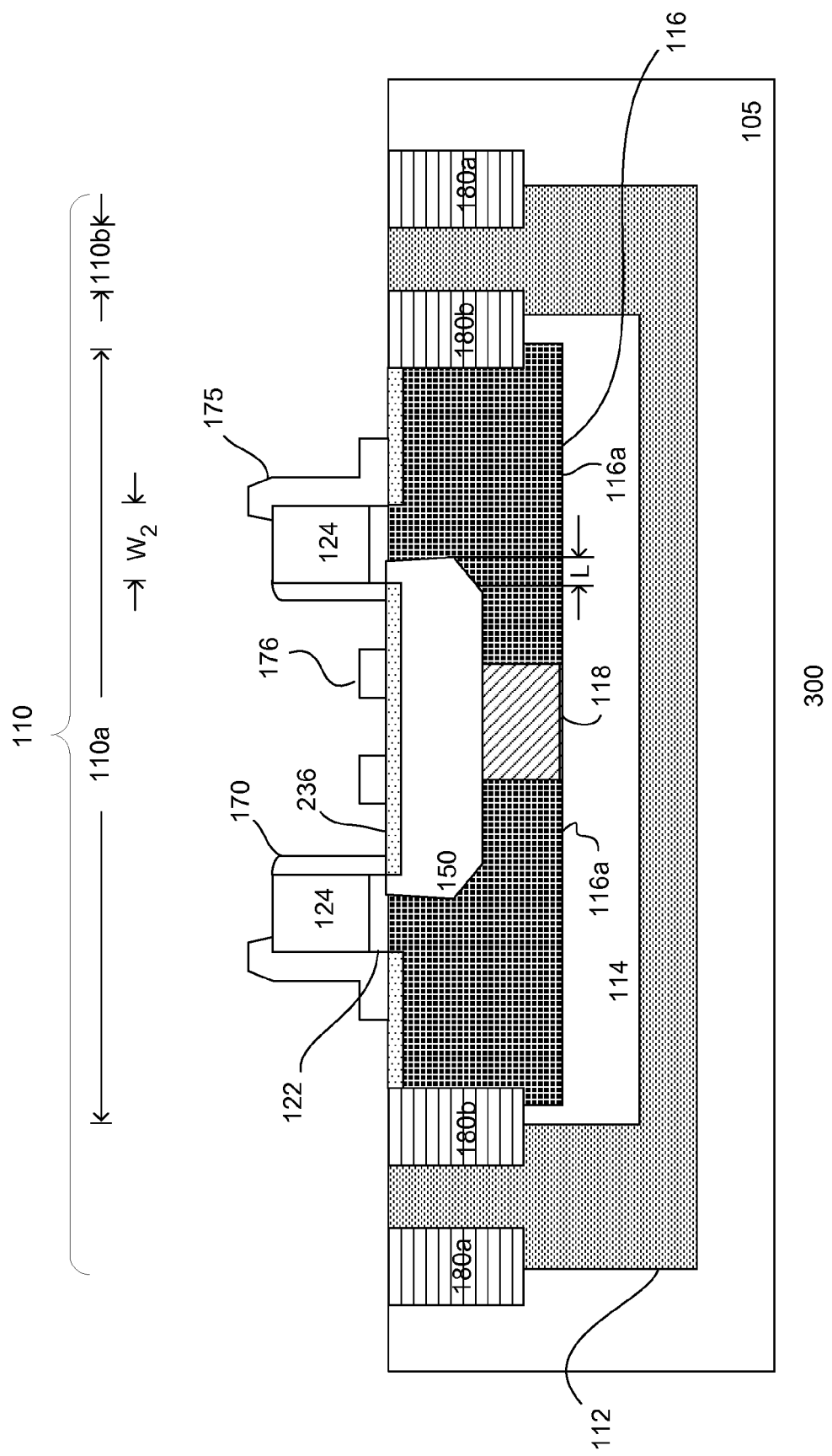

In one embodiment, salicide block spacers 175 are formed on the drain side of the gates, as shown in FIG. 3d. In one embodiment, a salicide block spacer includes an extension portion which provides a separation between a gate and its drain. The separation should be sufficient to avoid gate overlap of the drain. In one embodiment, the separation distance $D_S$ is about 0.4 μm. Providing other separation distances may also be useful. The separation of the gate from the drain helps the device to withstand higher operating voltage at the drain.

To form the salicide block spacers, a dielectric layer is formed on the substrate. The dielectric layer, for example, may be oxide, nitride, oxynitride or a combination thereof. Other types of dielectric materials may also be useful for the salicide block spacers. In some embodiments, the block spacer may have multiple dielectric layers to form a dielectric stack or sandwich. In one embodiment, the dielectric layer is different from that of the sidewall spacers. For example, the dielectric layer can be patterned selectively to the sidewall spacers. The dielectric layer is patterned to form the salicide block spacers.

In other embodiments, the dielectric layer is patterned to form salicide block spacers and surface spacers 176. The surface spacers separate the first and second sub-source regions of the source region.

Patterning of the dielectric layer can be achieved using, for example, mask and etch techniques. For example, a photoresist layer is formed over the dielectric layer and patterned using a lithographic mask, exposing portions of the dielectric layer to be removed. An anisotropic etch, such as a RIE, is performed to remove exposed portions of the dielectric layer. The sidewall spacers remain on the sidewalls of the gates. To improve lithographic resolution, an anti-reflective coating (ARC) can be provided beneath the photoresist. Other techniques for patterning the dielectric layer may also be useful.

Figure 3E:
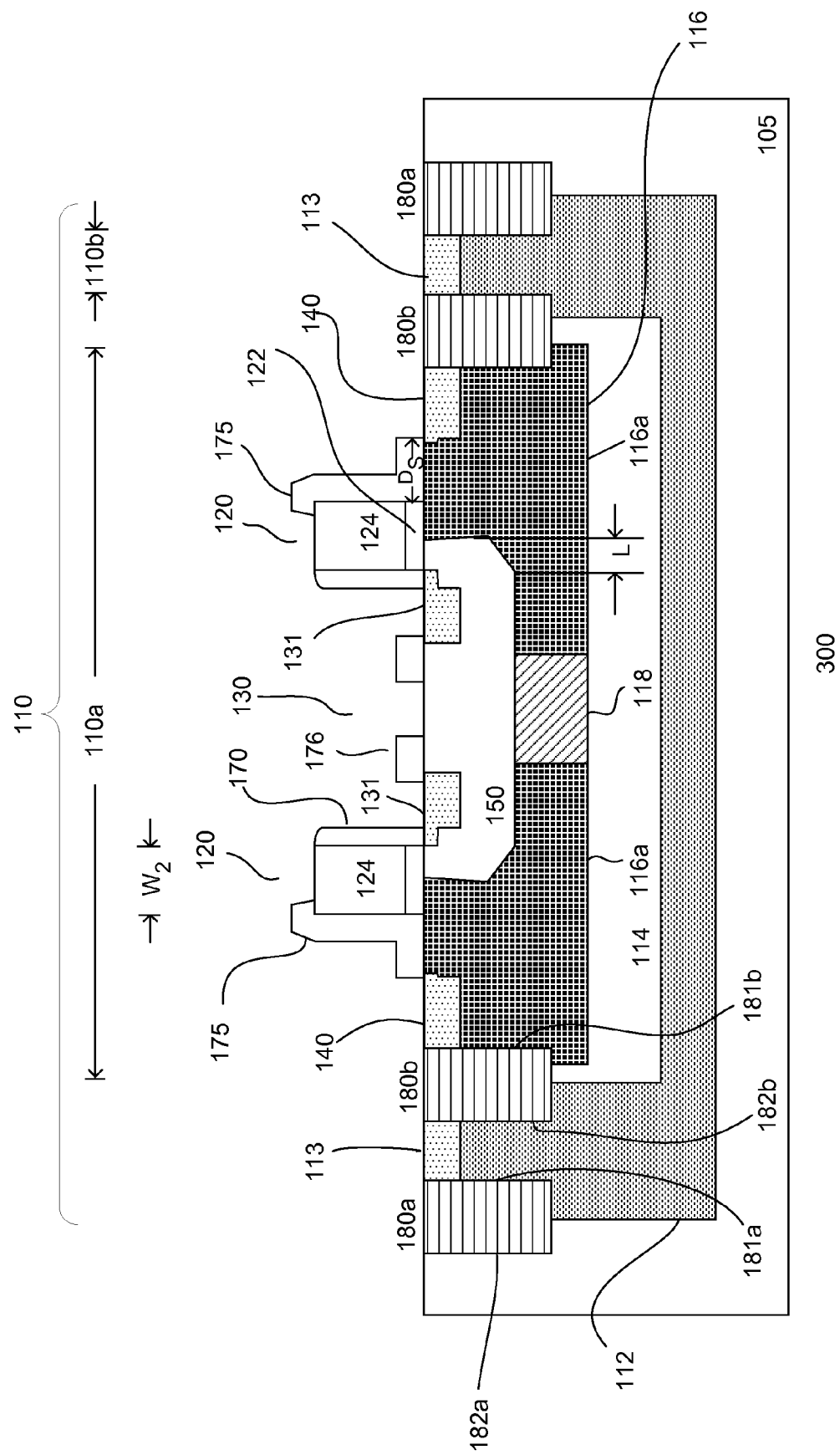

In FIG. 3e, first sub-source regions 131 and drain regions 140 are formed on the substrate. In one embodiment, the process of forming first sub-source and drain regions also forms deep device well contact regions. The first sub-source, drain and deep well contact regions are heavily doped regions having first polarity type dopants. The depth of the first sub-source, drain and deep well contact regions, for example, is about 0.05-0.5 μm. A first S/D implant mask may be used to implant dopants to form the different doped regions. The first S/D implant mask, for example, comprises photoresist. The implant mask may be patterned to expose the source (e.g., first sub-source), drain and deep well contact regions of the transistors.

Figure 3F:
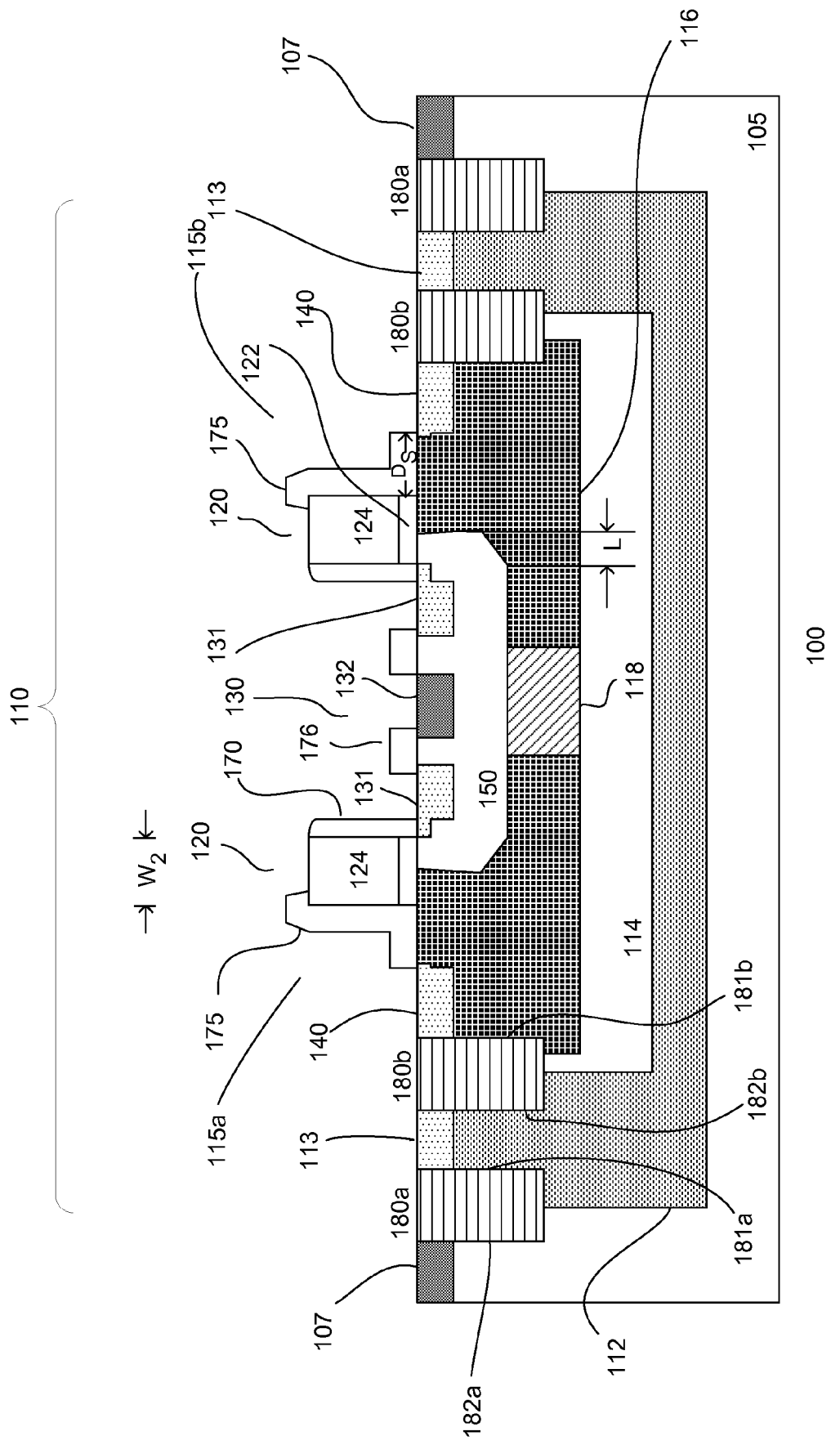

Referring to FIG. 3f, an isolated body contact (e.g., second sub-source) region 132 is formed. In one embodiment, the process of forming the isolated body contact region also forms substrate contact regions 107. The second isolated body contact and substrate contact regions are heavily doped regions having second polarity type dopants. The depth of the second sub-source and substrate contact regions, for example, is about 0.05-0.5 μm. A second S/D implant mask may be used to implant dopants to form the different doped regions. The second S/D implant mask, for example, comprises photoresist. The implant mask may be patterned to expose the second isolated body contact and substrate contact.

In other embodiments, the first S/D implant mask may be used to form the isolated body contact along with appropriate contact regions while the second S/D implant mask may be used to form the source and drain regions along with appropriate contact regions.

In yet other embodiments, LDD regions are formed by using tilt implants when forming, for example the drain and first sub-source regions. This avoids the need to form LDD regions prior to forming sidewall spacers.

As described, the transistor pair is configured with a common source region. Alternatively, the transistor pair may be configured with a common drain region. Additionally, the transistor region may include other number of transistors. For example, any odd or even number of transistors may be provided. In the case of odd applications greater than or equal to 3, one or more transistor pairs may be provided an additional transistor, such as that described in FIGS. 1a-b. Forming the different embodiments involves changing the pattern on the lithographic mask. No additional steps would be required. Furthermore, it is understood that the process as described is not limited to the specific sequence of steps disclosed. For example, some steps may be performed in different sequences and/or additional steps may be added.

The embodiments described are highly compatible with current processes for forming ICs. For example, the embodiments described are highly compatible with current processes which form LV and HV devices. The various wells utilize to form LV and HV devices can be used. An additional body mask may be employed to form the body.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A device comprising:
a substrate defined with a device region;
a transistor in the device region, wherein the transistor includes
a gate having first and second sides,
a first diffusion region in the device region adjacent to the first side of the gate, and
a second diffusion region in the device region adjacent to the second side of the gate, wherein the first and second diffusion regions comprise dopants of a first polarity type;
a self-aligned body disposed in the substrate adjacent to the first side of the gate, the body comprises dopants of a second polarity type, the self-aligned body encompassing the first diffusion region, the self-aligned body having an under-lapping portion under the gate, the under-lapping portion having a length L;
a drift well in the substrate having dopants of the first polarity type, the drift well encompassing at least a portion of the body and second diffusion region;

a second isolation well in the substrate encompassing the drift well, the second isolation well having second polarity type dopants; and a body connector having second polarity type dopants in communication with the body and second isolation well.

2. The device of claim 1 comprises a first isolation well in the substrate having first polarity type dopants, the first isolation well encompassing the second isolation well, wherein the first and second isolation wells isolate the device from the substrate.

3. The device of claim 2 comprises a body contact having second polarity type dopants, the body contact providing a connection to the second isolation well for biasing the isolation well.

4. The device of claim 3 wherein the body contact and first diffusion region are coupled to a common signal.

5. The device of claim 1 comprises a block spacer on the second side of the gate, the block spacer providing a distance Ds between the second diffusion region and the second side of the gate to increase the distance of a drift region between the body and the second diffusion region.

6. A device comprising:
a substrate defined with a device region, wherein the device region includes a drift well having first polarity type dopants;
a doped isolation well disposed in the substrate, wherein the drift well is disposed in the doped isolation well;
a transistor in the device region, wherein the transistor includes
a gate having first and second sides,
first and second diffusion regions in the device region adjacent to the first and second sides of the gate, wherein the first and second diffusion regions comprise dopants of a first polarity type; and
a self-aligned body disposed within the drift well in the substrate adjacent to the first side of the gate, wherein the self-aligned body comprises dopants of a second polarity type and has an under-lapping portion on the first side of the gate with a length L which is small to achieve a low Rdson, and the first diffusion region is within the self-aligned body and the second diffusion region is within the drift well.

7. The device of claim 6 wherein
the doped isolation well comprises second polarity type dopants; and comprises
an isolation well in the substrate having first polarity type dopants, the isolation well encompasses the doped isolation well.

8. The device of claim 6 further comprises a body connector having second polarity type dopants in communication with the self-aligned body and doped isolation well.

9. The device of claim 6 further comprises a body contact in the self-aligned body, wherein the body contact provides a bias terminal for biasing the doped isolation well.

10. The device of claim 9 wherein the first diffusion region and the body contact are coupled to a common signal.

11. The device of claim 9 further comprises a surface spacer to separate the first diffusion region and the body contact.

12. The device of claim 6 comprises a block spacer on the second side of the gate, the block spacer provides a distance Ds between the second diffusion region and the second side of the gate to increase the distance of a drift region between the self-aligned body and the second diffusion region.

13. The device of claim 6 comprising:
first and second isolation regions which surround the device region; and
an internal isolation region which separates the device region into first and second device sub-regions, wherein the internal isolation region surrounds the first device sub-region.

14. The device of claim 13 wherein the second diffusion region is disposed in between the second side of the gate and the internal isolation region.

15. The device of claim 6 wherein the device region comprises a plurality of transistors arranged in finger arrangement.

16. A device comprising:
a substrate having first and second isolation wells in a device region, wherein the second isolation well is disposed within the first isolation well;
a drift well disposed within the second isolation well;
a transistor in the device region, wherein the transistor includes
a gate having first and second sides, and
first and second diffusion regions disposed adjacent to the first and second sides of the gate;
a self-aligned body disposed in the substrate adjacent to the first side of the gate, wherein the self-aligned body comprises an under-lapping portion with a length L beneath the gate, and the first diffusion region is within the self-aligned body and the second diffusion region is within the drift well; and
a body connector disposed in the drift well, wherein the body connector couples the self-aligned body to the second isolation well.

17. The device of claim 16 further comprises a body contact in the self-aligned body, wherein the body contact provides a bias signal to bias the second isolation well.

18. The device of claim 16 wherein the body contact and the first diffusion region are commonly coupled.

19. The device of claim 16 further comprises a surface spacer to separate the first diffusion region and the body contact.

20. The device of claim 16 comprises a block spacer on the second side of the gate, the block spacer provides a distance Ds between the second diffusion region and the second side of the gate to increase the distance of a drift region between the self-aligned body and the second diffusion region.

* * * * *